(12) United States Patent
Ruben et al.

(10) Patent No.: US 9,688,053 B2
(45) Date of Patent: *Jun. 27, 2017

(54) DEVICES FORMED WITH TECHNIQUES FOR BONDING SUBSTRATES USING AN INTERMEDIATE LAYER

(71) Applicant: Medtronic, Inc., Minneapolis, MN (US)

(72) Inventors: David A Ruben, Mesa, AZ (US); Michael S Sandlin, Chandler, AZ (US)

(73) Assignee: Medtronic, Inc., Minneapolis, MN (US)

( * ) Notice: Subject to any disclaimer, the term of this patent is extended or adjusted under 35 U.S.C. 154(b) by 22 days.

This patent is subject to a terminal disclaimer.

(21) Appl. No.: 14/837,743

(22) Filed: Aug. 27, 2015

(65) Prior Publication Data
US 2015/0367598 A1 Dec. 24, 2015

Related U.S. Application Data

(60) Continuation of application No. 14/447,722, filed on Jul. 31, 2014, now Pat. No. 9,120,287, which is a
(Continued)

(51) Int. Cl.
*C03C 27/06* (2006.01)
*B32B 7/04* (2006.01)
(Continued)

(52) U.S. Cl.
CPC .............. *B32B 7/04* (2013.01); *B32B 17/06* (2013.01); *H01L 21/2007* (2013.01);
(Continued)

(58) Field of Classification Search
CPC .................................................... C03C 27/06
See application file for complete search history.

(56) References Cited

U.S. PATENT DOCUMENTS 4,810,318 A 3/1989 Haisma et al.
5,054,683 A 10/1991 Haisma et al.
(Continued)

FOREIGN PATENT DOCUMENTS

EP 0232935 A1 8/1987
EP 1864784 A1 12/2007
(Continued)

OTHER PUBLICATIONS

Wiemer et al., "Developments trends in the field of wafer bonding technologies," 214th ECS Meeting, Abstract #2229, Oct. 12-Oct. 17, 2008, Honolulu, HI (1 p.).
(Continued)

*Primary Examiner* — John C Ingham

(57) ABSTRACT

A method includes depositing a thin film on a first surface of a first substrate and moving a second surface of a second substrate into contact with the thin film such that the thin film is located between the first and second surfaces. The method further includes generating electromagnetic (EM) radiation of a first wavelength, the first wavelength selected such that the thin film absorbs EM radiation at the first wavelength. Additionally, the method includes directing the EM radiation through one of the first and second substrates and onto a region of the thin film until the first and second substrates are fused in the region.

21 Claims, 16 Drawing Sheets

Related U.S. Application Data division of application No. 12/977,890, filed on Dec. 23, 2010, now Pat. No. 8,796,109.

(51) Int. Cl.

| | |
|---|---|
| *H01L 21/20* | (2006.01) |
| *B32B 17/06* | (2006.01) |
| *H05K 1/03* | (2006.01) |
| *H05K 1/11* | (2006.01) |
| *H05K 1/18* | (2006.01) |

(52) U.S. Cl.
CPC ......... *H05K 1/0306* (2013.01); *H05K 1/0313* (2013.01); *H05K 1/115* (2013.01); *H05K 1/183* (2013.01); *B32B 2250/02* (2013.01); *B32B 2457/00* (2013.01); *H05K 2201/0175* (2013.01); *Y10T 428/13* (2015.01); *Y10T 428/24562* (2015.01); *Y10T 428/265* (2015.01); *Y10T 428/30* (2015.01); *Y10T 428/31678* (2015.04)

(56) References Cited

U.S. PATENT DOCUMENTS

| | | | |
|---|---|---|---|
| 5,489,321 | A | 2/1996 | Tracy et al. |
| 5,647,932 | A | 7/1997 | Taguchi et al. |
| 5,693,111 | A | 12/1997 | Kadowaki et al. |
| 6,477,901 | B1 | 11/2002 | Tadigadapa et al. |
| 6,555,025 | B1 | 4/2003 | Krupetsky et al. |
| 6,762,072 | B2 | 7/2004 | Lutz |
| 6,822,326 | B2 | 11/2004 | Engquist et al. |
| 7,078,726 | B2 | 7/2006 | Pichler et al. |
| 7,417,307 | B2 | 8/2008 | Haluzak et al. |
| 7,540,934 | B2 | 6/2009 | Hofmann et al. |
| 8,125,146 | B2 | 2/2012 | Park |
| 8,448,468 | B2 | 5/2013 | Pastel et al. |
| 8,666,505 | B2 | 3/2014 | O'Brien et al. |
| 8,796,109 | B2 | 8/2014 | Ruben et al. |
| 2002/0115920 | A1 | 8/2002 | Rich et al. |
| 2004/0012083 | A1 | 1/2004 | Farrell et al. |
| 2004/0082145 | A1 | 4/2004 | Reichenbach et al. |
| 2005/0151151 | A1 | 7/2005 | Hawtof et al. |
| 2005/0284815 | A1 | 12/2005 | Sparks et al. |
| 2006/0084348 | A1* | 4/2006 | Becken ............... C03C 27/06 445/25 |
| 2006/0267167 | A1 | 11/2006 | McCain |
| 2007/0170839 | A1 | 7/2007 | Choi et al. |
| 2008/0102096 | A1 | 5/2008 | Molin et al. |
| 2010/0262208 | A1 | 10/2010 | Parker |
| 2010/0263794 | A1 | 10/2010 | George et al. |
| 2010/0304151 | A1 | 12/2010 | Tuennermann et al. |
| 2011/0209813 | A1* | 9/2011 | Shibuya ................ C03C 8/14 156/89.12 |

FOREIGN PATENT DOCUMENTS

| | | |
|---|---|---|
| WO | WO 2008044349 A1 | 4/2008 |
| WO | WO 2010117382 A1 | 10/2010 |

OTHER PUBLICATIONS

Sari et al., "Applications of laser transmission processes for the joining of plastics, silicon and glass micro parts," Microsyst Technol (2008) 14: 1879-1886, published online Jul. 18, 2008.
Theppakuttai et al., "Localized Laser Transmission Bonding for Microsystem Fabrication and Packaging," Journal of Manufacturing Processes, vol. 6, No. 1, 2004 (8 pp.).
Wild et al., "Locally selective bonding of silicon and glass with laser," Sensors and Actuators A: Physical, vol. 93, Issue 1, Aug. 25, 2001, p. 63-69.
Park, "Characterization of transmission laser bonding (TLB) technique for microsystem packaging," Arizona State University, May 2006 (135 pp.).
U.S. Appl. No. 12/912,433, by Ralph B. Danzl, filed Oct. 26, 2010.
Office Action from co-pending U.S. Appl. No. 12/912,433 dated Jun. 7, 2013 (13 pages).
Office Action from co-pending U.S. Appl. No. 12/912,433 dated Mar. 14, 2013 (14 pages).
International Preliminary Report on Patentability for corresponding patent application No. PCT/US2011/034371, mailed Jul. 4, 2013, 7 pages.
Gillner et al., "Laser Bonding of Micro Optical Components," Proceedings of SPIE, vol. 4941, pp. 112-120, Oct. 2003.
Witte et al., "Laser joining of glass with silicon," Proceedings of SPIE, vol. 4637, Jan. 21, 2002, pp. 487-495.
International Search Report and Written Opinion of international application No. PCT/US2011/034371, dated Jun. 24, 2011, 11 pp.
Final Office Action from U.S. Appl. No. 12/912,433 dated Sep. 24, 2013, "Laser Assisted Direct Bonding", (17 pages).
Response to Office Action dated Sep. 24, 2013, from U.S. Appl. No. 12/912,433, filed Nov. 12, 2013, 14 pp.
Brown, "Precision Laser Welding of Clear Thermoplastics Without Additives", Medical Design Technology, Aug. 5, 2013, 7 pages. Located on the World Wide Web at http://www.mdtmag.com/articles/2013/08/precision-laser-welding-clear-thermoplastics-without-additives.

* cited by examiner

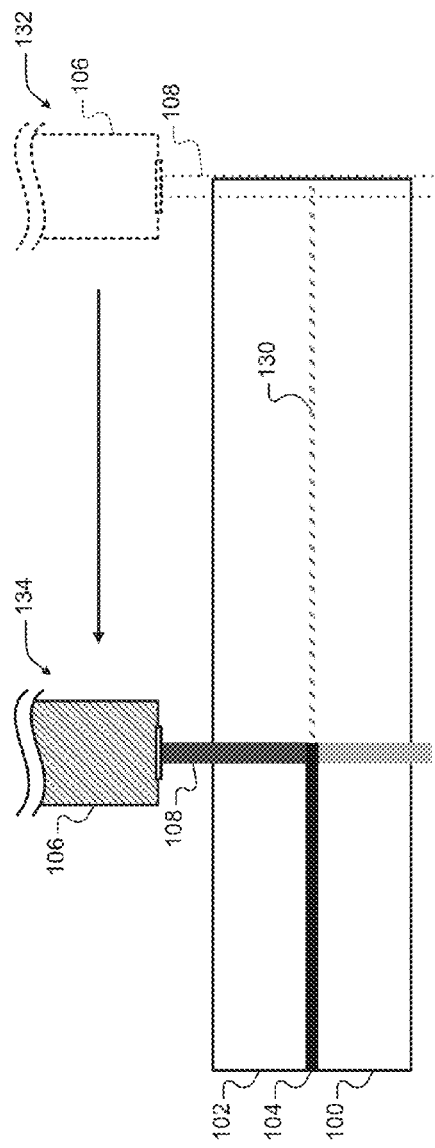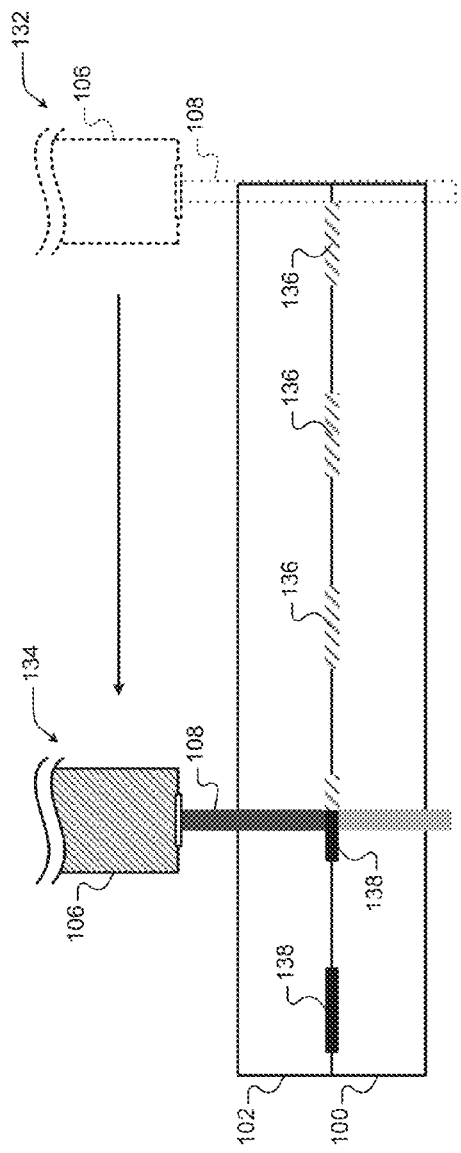
FIG. 4A
FIG. 4B

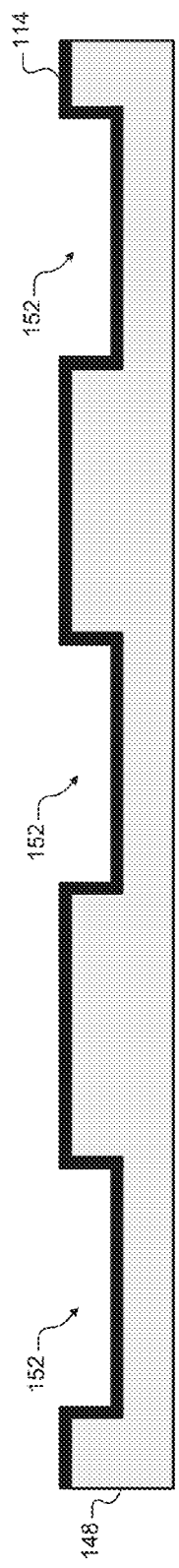
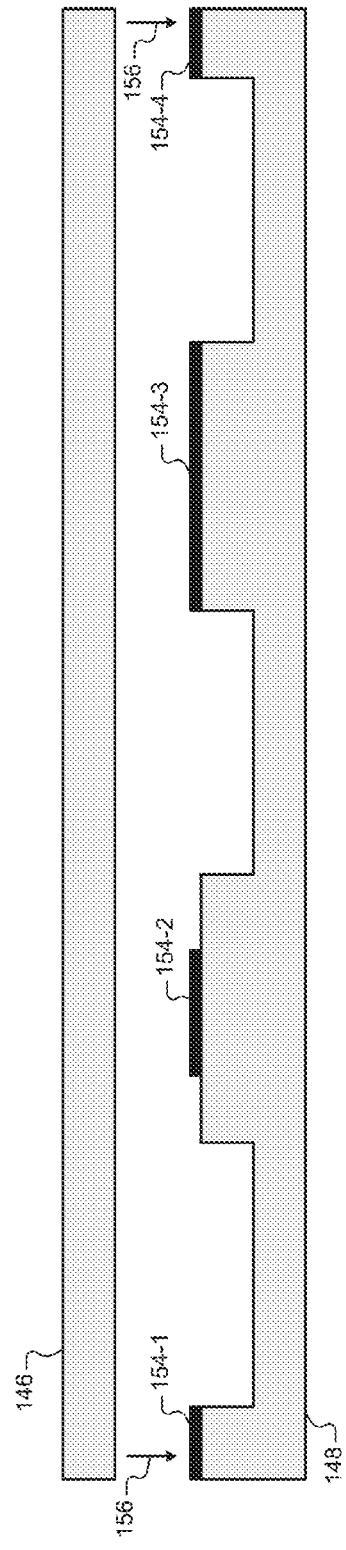
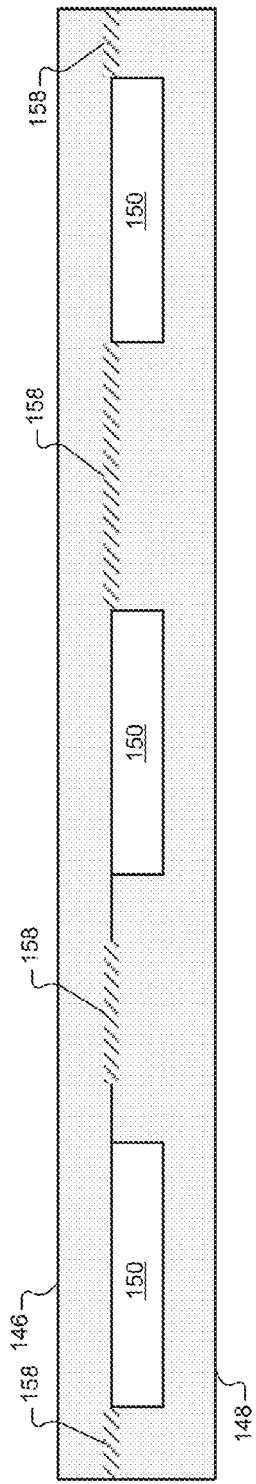
FIG. 5A
FIG. 5B
FIG. 5C

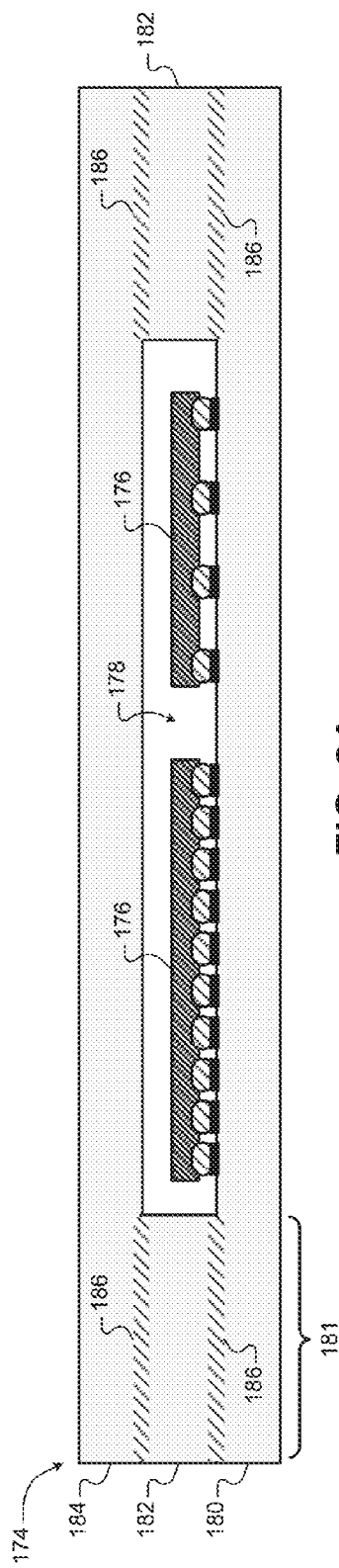
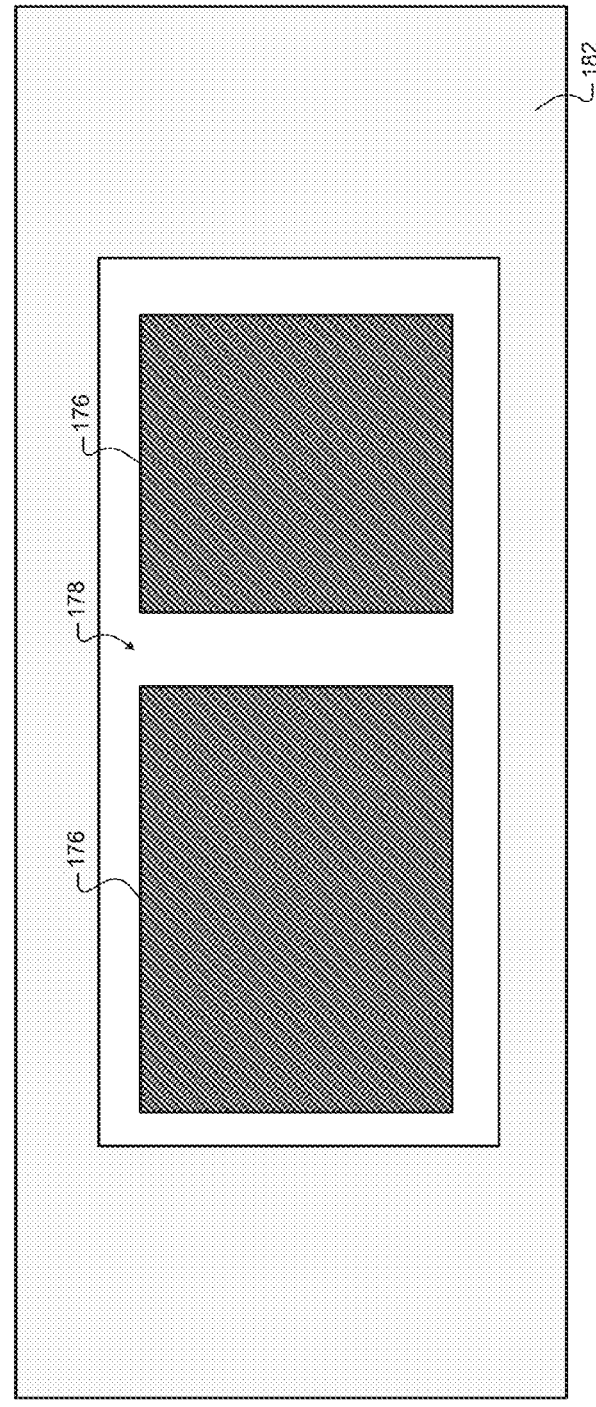
FIG. 8A
FIG. 8B

US 9,688,053 B2

DEVICES FORMED WITH TECHNIQUES FOR BONDING SUBSTRATES USING AN INTERMEDIATE LAYER

RELATED APPLICATION

This application is a continuation of U.S. patent application Ser. No. 14/447,722, filed Jul. 31, 2014 entitled "TECHNIQUES FOR BONDING SUBSTRATES USING AN INTERMEDIATE LAYER", issuing on Sep. 1, 2015 as U.S. Pat. No. 9,120,287, which is a divisional of U.S. patent application Ser. No. 12/977,890, filed Dec. 23, 2010 entitled "TECHNIQUES FOR BONDING SUBSTRATES USING AN INTERMEDIATE LAYER", issued as U.S. Pat. No. 8,796,109, the contents of both of which are herein incorporated by reference in their entirety.

TECHNICAL FIELD

The disclosure relates to bonding substrates, and, more particularly, to bonding substrates using an intermediate layer.

BACKGROUND

The semiconductor and electronics industry uses material bonding techniques to bond different substrates together during semiconductor/circuit fabrication. Direct bonding is one type of bonding technique that is frequently used to bond different materials together. Direct bonding involves bonding different materials together without the aid of a specific bonding agent such as, for example, adhesive, wax, solder, or the like. Direct bonding techniques may be used to form component packages that house electronic components. A component package may be useful to protect the electronic components from different environmental conditions such as, e.g., pressure changes, moisture, bodily fluids, or the like.

In some examples, component packages may be placed in an oven after bringing the substrates of the component package in close contact to cause covalent bonds to form between the different substrates. Because this heating process included in forming a direct bond may involve heating the bond to an elevated temperature, temperature-sensitive components of the package may experience thermal damage when placed in a package that is subsequently sealed using direct bonding techniques. Moreover, because the process of forming a direct bond may involve one or more cycles of heating and cooling, mismatches between coefficients of thermal expansion for different substrates being bonded may cause warping and thermal stress fractures to develop between the different substrates. Warping and thermal stress fractures may weaken the bond between the different substrates and may reduce the hermeticity of a component package formed using direct bonding techniques.

SUMMARY

A laser bonding process according to the present disclosure fuses two substrates together using an intermediate layer. The laser bonding process may include the following procedures. First, the substrates to be bonded may be polished and cleaned. The intermediate layer may then be deposited as a thin film on one or both of the substrates. Subsequently, the substrates may be brought together such that the intermediate layer is sandwiched between the two substrates. Electromagnetic (EM) radiation, e.g., output from a laser device, may then be directed through one of the substrates and onto the intermediate layer in order to heat the intermediate layer. This heating of the intermediate layer may form an enhanced bond between the substrates. The enhanced bond formed between the substrates may be transparent, mechanically strong, corrosion resistant, and may be used to form a hermetically sealed cavity, in some examples.

The parameters of the laser bonding process, e.g., the wavelength of EM radiation, the substrate materials used, and intermediate layer materials used, may be selected such that the substrates are transparent to the EM radiation while the intermediate layer absorbs the EM radiation. Thus, the parameters of the process may be selected such that EM radiation may be transmitted through one of the substrates and absorbed by the intermediate layer sandwiched between the substrates. The heat generated in the intermediate layer due to the absorption of the EM radiation by the intermediate layer may fuse the two substrates together. The heat generated in the intermediate layer may heat only a localized region of the substrates, and therefore the laser bonding process according to the present disclosure may be a low temperature processing technique that is suitable for forming hermetically sealed enclosures including temperature sensitive electronic components. Additionally, since similar substrate materials may be used to form the enclosures and since the process is performed at room temperature, the enclosures produced may not incur stress fractures due to generalized wafer heating and cooling that may adversely affect the hermeticity of the enclosure.

Such hermetically sealed enclosures fabricated according to the present disclosure may be used to house a broad range of electronic components, including, but not limited to, solar cells, electronic display devices, microelectronics, and micro-electromechanical systems (MEMS) components. Additionally, the materials used as substrates for the enclosures may be biocompatible (e.g., glass), and therefore the enclosed electronic devices may be implantable. Accordingly, in some examples the hermetically sealed enclosures may house implantable medical device electronics such as sensors, electrical stimulation devices, and physiological measurement devices. For example, the enclosed electronic devices may, via conductive feedthroughs in the enclosure, provide electrical stimulation (e.g., cardiac pacing or neuorstimulation) and measure electrical activity of the heart, nerves, or muscles.

In one example according to the present disclosure, a method comprises depositing a thin film on a first surface of a first substrate and moving a second surface of a second substrate into contact with the thin film such that the thin film is located between the first and second surfaces. The method further comprises generating electromagnetic (EM) radiation of a first wavelength, the first wavelength selected such that the thin film absorbs EM radiation at the first wavelength. Additionally, the method comprises directing the EM radiation through one of the first and second substrates and onto a region of the thin film until the first and second substrates are fused in the region.

In another example according to the present disclosure, a device comprises a first glass substrate, a second glass substrate, and a bonding region between the first and second glass substrates. The first and second glass substrates are fused together in the bonding region and the bonding region comprises silicon.

In another example according to the present disclosure, a method comprises depositing a thin film on a first surface of a first wafer and moving a second surface of a second wafer into contact with the thin film such that the thin film is located between the first and second surfaces and such that the first and second wafers at least partially define a plurality of cavities. The method further comprises generating electromagnetic (EM) radiation of a first wavelength, the first wavelength selected such that the thin film absorbs EM radiation at the first wavelength. Additionally, the method comprises directing the EM radiation through one of the first and second wafers and onto a region of the thin film until the first and second wafers are fused in the region.

In another example according to the present disclosure, a method comprises forming a stack of N substrates. At least one of a plurality of intermediate layers is disposed between each of the N substrates. The method further comprises generating electromagnetic (EM) radiation of a first wavelength, the first wavelength selected such that each of the plurality of intermediate layers absorbs EM radiation at the first wavelength. Additionally, the method comprises directing the generated EM radiation through the stack of N substrates and the plurality of intermediate layers until each of the N substrates are fused to another one of the N substrates. N is an integer greater than 2.

The details of one or more examples are set forth in the accompanying drawings and the description below. Other features, objects, and advantages will be apparent from the description and drawings, and from the claims.

BRIEF DESCRIPTION OF THE DRAWINGS

FIG. 4A shows an enhanced bond formed along a length of the first and second substrates.

FIG. 4B shows a plurality of separate enhanced bonds along a length of the first and second substrates.

FIGS. 5A-5C show bonding planar and recessed substrates to form cavities defined by the planar and recessed substrates.

FIGS. 8A-8B show a packaged device including electronic components.

DETAILED DESCRIPTION

A process for bonding two substrates together using an intermediate layer is described herein. The intermediate layer, which is sandwiched between the two substrates, may be heated using a source of electromagnetic (EM) radiation, e.g., a laser, in order to bond the first and second substrates together. The bond formed between the two substrates after application of the EM radiation to the intermediate layer may be referred to as an "enhanced bond." The processes used for preparing the substrates for bonding, depositing the intermediate layer, and forming the enhanced bonds of the present disclosure may be referred to collectively as a "laser bonding process."

Figure 1A:
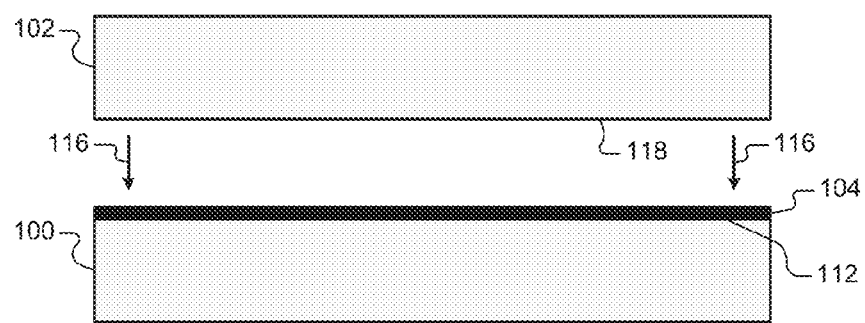
FIGS. 1A-1C show a laser bonding process used to bond a first substrate to a second substrate using an intermediate layer.
Figure 1B:
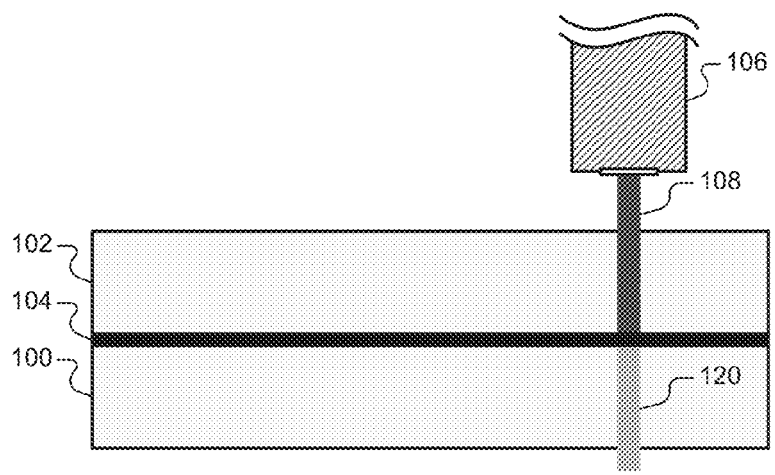
Figure 1C:
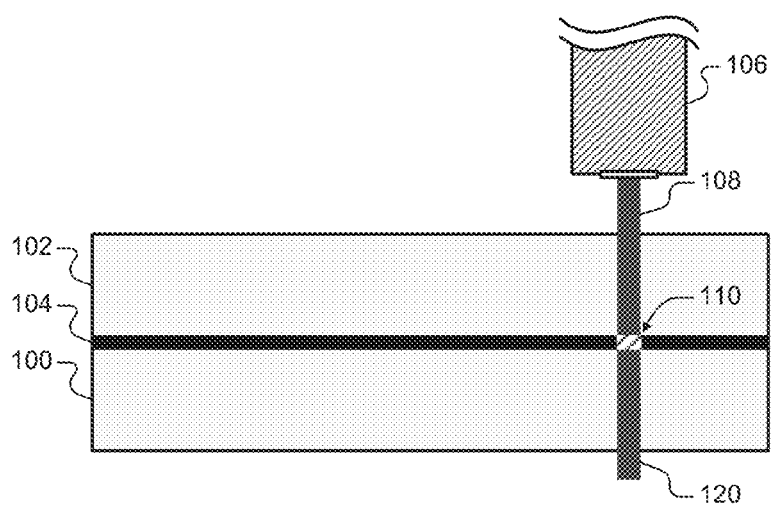

FIGS. 1A-1C illustrate a laser bonding process used to bond a first substrate 100 to a second substrate 102 using an intermediate layer 104. In general, the laser bonding process according to the present disclosure includes depositing intermediate layer 104 on first substrate 100 and/or second substrate 102, sandwiching intermediate layer 104 between first and second substrates 100, 102, and directing EM radiation, e.g., light from a laser 106, through second substrate 102 and/or first substrate 100 and onto intermediate layer 104 to fuse first and second substrates 100, 102 together. An enhanced bond, i.e., a fused region between first and second substrates 100, 102, may be formed between first and second substrates 100, 102 after sufficient application of EM radiation onto immediate layer and subsequent withdrawal of the EM radiation.

FIGS. 1A-1C illustrate separate example steps of the laser bonding process. FIG. 1A shows second substrate 102 moving toward intermediate layer 104 deposited on first substrate 100. FIG. 1B shows application of EM radiation 108 from laser 106 through second substrate 102 and onto intermediate layer 104. In FIG. 1B, a portion of EM radiation 108 is absorbed by intermediate layer 104 and a portion of EM radiation 108 is transmitted through first substrate 100. FIG. 1C shows transmission of EM radiation 108 through intermediate layer 104 and first substrate 100 after formation of an enhanced bond 110. As illustrated in FIG. 1C, an amount of EM radiation transmitted through intermediate layer 104 may increase after formation of enhanced bond 110 between first and second substrates 100, 102. Further description of the laser bonding process and the enhanced bond formed between first and second substrates 100, 102 is described in detail hereinafter.

The parameters of EM radiation 108 (e.g., wavelength and power), the materials used for first and second substrates 100, 102, and the materials used for intermediate layer 104 may be selected based on various considerations. Generally, first and second substrates 100, 102 may be selected such that first and second substrates 100, 102 are transparent to EM radiation 108. For example, first and second substrates 100, 102 may be substantially transparent to EM radiation 108 such that EM radiation 108 may be transmitted through first and second substrates 100, 102, instead of being absorbed by first and second substrates 100, 102. Therefore, in some examples, EM radiation 108 may not produce heating of first and second substrates 100, 102 through absorption to an extent that causes the material comprising substrates 100, 102 to melt or flow. Therefore, it follows that, in these examples, the power level and wavelength of EM radiation 108 may be selected such that EM radiation 108 may not directly damage, ablate, warp, or cut the first and second substrates 100, 102.

Intermediate layer 104 may be selected such that intermediate layer 104 absorbs EM radiation 108 that is transmitted through second substrate 102. Absorption of EM radiation 108 causes heating of intermediate layer 104 in the region of intermediate layer 104 that receives EM radiation 108. Heating in intermediate layer 104 may in turn cause heating in first and second substrates 100, 102 (e.g., through conduction) in the region of intermediate layer 104 that receives EM radiation 108. Subsequent to cessation of heating of intermediate layer 104 by EM radiation 108, enhanced bond 110 may be formed in the region heated by EM radiation 108. The enhanced bond may differ (e.g., mechanically and optically) from other bonds (e.g., direct bonds) along the interface between second substrate 102 and intermediate layer 104. The enhanced bond may also possess different mechanical and corrosion resistance properties than the bulk of first and second substrates 100, 102.

First and second substrates 100, 102 may be selected from a variety of materials. In some examples, first and second substrates 100, 102 may be glass substrates (e.g., borosilicate glass or soda-lime glass substrates). In examples where first and second substrates 100, 102 comprise glass substrates, first and second substrates 100, 102 may comprise a glass wafer, or a portion of a glass wafer. An example glass wafer suitable for forming enhanced bonds using the laser bonding process of the present disclosure may include borosilicate glass, e.g., Borofloat 33® which is available from SCHOTT North America, Inc., of Elmsford, N.Y. Although first and second substrates 100, 102 may represent glass substrates, in other examples, first and second substrates 100, 102 may include other materials, such as quartz, silica, sapphire, silicon carbide, diamond, and gallium nitride.

Intermediate layer 104 may be selected from one or more of a variety of materials. In some examples, intermediate layer 104 may be a thin film layer of amorphous silicon, which may be doped in some cases. In other examples, intermediate layer 104 may be a thin film metal, such as titanium or niobium, or other metals. In other examples, intermediate layer 104 may be doped or composite glass deposited using physical vapor deposition (PVD) and/or chemical vapor deposition (CVD) techniques. In still other examples, intermediate layer 104 may be an alumina thin film.

In examples where intermediate layer 104 includes amorphous silicon, intermediate layer 104 may be deposited using various techniques, such as PVD (e.g., sputtering). In examples where intermediate layer 104 includes other materials, it is contemplated that other deposition techniques may be used, such as CVD. In some examples, intermediate layer 104 may comprise a single material, e.g., amorphous silicon. In other examples, intermediate layer 104 may comprise more than one material, e.g., alloys of metals and/or multilayer structures.

Laser 106 may represent one or more of a variety of EM radiation sources. Generally, laser 106 may represent any one or more of a variety of available laser devices that produce EM radiation having various known properties. For example, laser 106 may generate EM radiation 108 having a relatively narrow set of wavelengths (e.g., a "single wavelength"). It is also contemplated that EM radiation 108 emitted by laser 106 may, as illustrated, form a collimated beam that may not be focused at a particular point within or between first and second substrates 100, 102 or intermediate layer 104. In other examples, EM radiation 108 emitted by laser 106 may be focused at a focal point on intermediate layer 104 in order to generate a greater amount of heat in intermediate layer 104 while using a reduced power level of EM radiation 108 relative to using a collimated beam.

Figure 11:
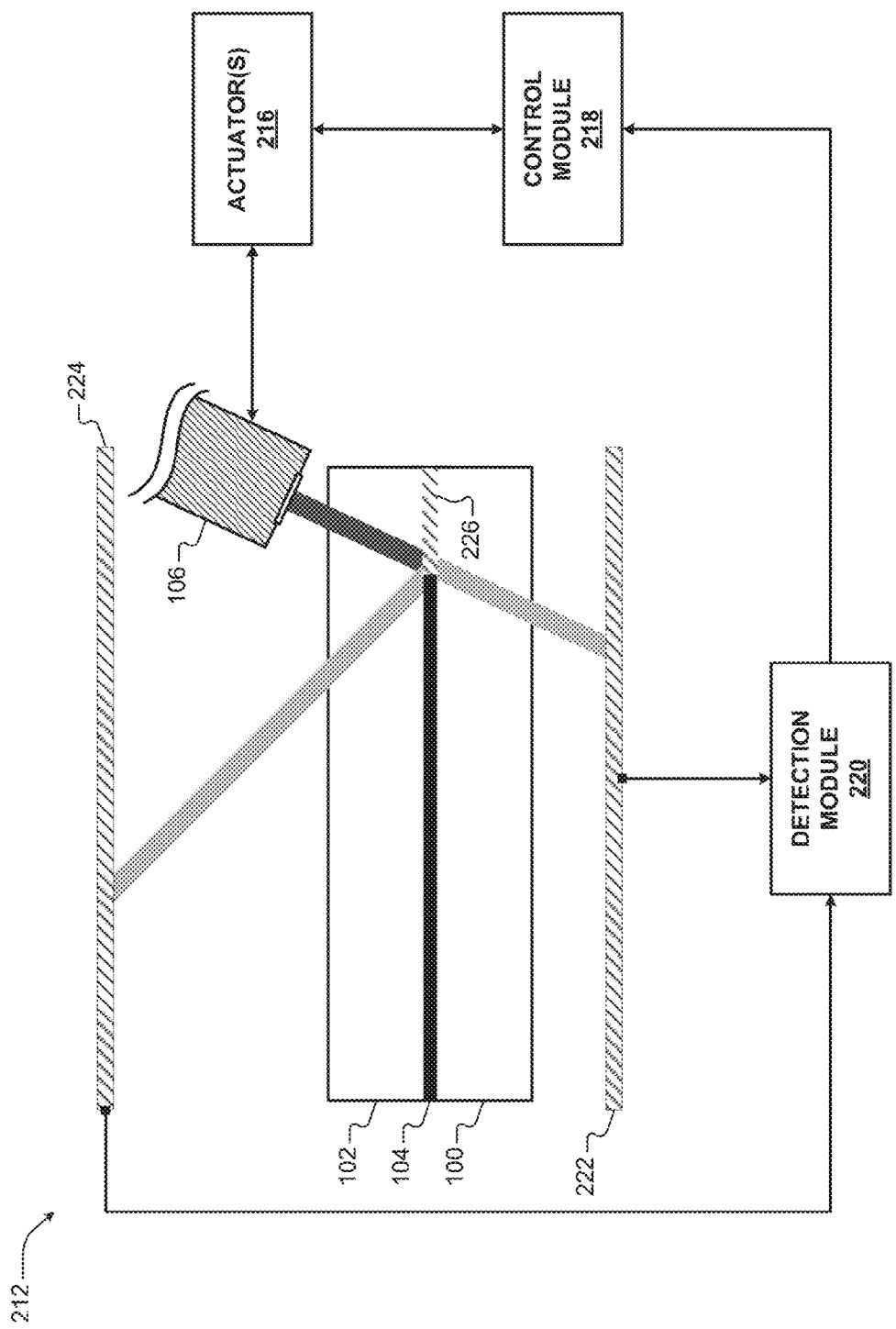
FIG. 11 illustrates an example fabrication system that includes a reflection sensor that detects electromagnetic (EM) radiation that is reflected off of an intermediate layer and/or an enhanced bond.

In general, as described above, laser 106 may be selected such that EM radiation 108 emitted from laser 106 is transmitted through first and second substrates 100, 102 and absorbed by intermediate layer 104. For example, some or all of EM radiation 108 may be absorbed by intermediate layer 104. Intermediate layer 104 may be heated in response to absorption of EM radiation 108. A portion of EM radiation 108 that is not absorbed by intermediate layer 104 may be transmitted through first substrate 100 or reflected off of intermediate layer 104, as illustrated in FIG. 11.

Although laser 106 may emit EM radiation 108 having a narrow range of wavelengths, in other examples, laser 106 may represent one or more devices, laser or otherwise, that emit EM radiation having a wider range of wavelengths than a single a typical laser. A wide variety of devices may be used to emit EM radiation 108 having a narrow or wide range of wavelengths. In some examples, laser 106 may include, but is not limited to, one or more laser devices including, but not limited to diode and fiber lasers. Laser sources may also include, for example, Ti:sapphire lasers, Ar ion lasers, Nd:YAG lasers, XeF lasers, HeNe lasers, Dye lasers, GaAs/AlGaAs lasers, Alexandrite lasers, InGaAs lasers, InGaAsP lasers, Nd:glass lasers, Yb:YAG lasers, and Yb fiber lasers. The laser devices may also include one of continuous wave, modulated or pulsed modes. Accordingly, a wide variety of laser devices may be used in the laser bonding process. In some examples, a power level of laser 106 may be set to approximately 20-50 W, distributed across an approximate focused beam diameter of 200 um, with a top hat spatial energy profile.

In summary, laser 106 may represent a single laser device that emits EM radiation having a narrow range of wavelengths, multiple laser devices that emit EM radiation having a wider range of wavelengths, or other sources of EM radiation that emit an even broader spectrum.

In examples where laser 106 represents a device that emits a range of wavelengths, intermediate layer 104, and first and second substrates 100, 102 may be selected such that intermediate layer 104 absorbs some or all of the range of wavelengths while first and second substrates 100, 102 transmit some or all of the range of wavelengths absorbed by intermediate layer 104.

FIG. 1A shows intermediate layer 104 deposited on first surface 112 of first substrate 100. In some implementations, intermediate layer 104 may be deposited over the entire first surface 112 of first substrate 100. In other implementations, intermediate layer 104 may be deposited on only a portion of first surface 112, while the remaining portion of first surface 112 is not covered with intermediate layer 104. For example, intermediate layer 104 may first be deposited over the entire first surface 112 and then subsequently intermediate layer 104 may be patterned into various geometries (e.g., lines, squares, etc.). Intermediate layer 104 may be patterned using photolithography and etching processes. It is also contemplated that intermediate layer 104 may be patterned using other patterning techniques.

Intermediate layer 104 may be deposited in various thicknesses. In some examples, intermediate layer 104 may be deposited in thicknesses in the range of 10-60 nm. For example, when using amorphous silicon as intermediate layer 104 and borosilicate glass wafers as first and second substrates 100, 102, the range of thicknesses for the amorphous silicon layer may be approximately 10-60 nm. In this example, amorphous silicon having a thickness of less than 10-15 nm may cause shattering in the glass wafers upon coupling, whereas amorphous silicon layers having a thickness of greater than 60 nm may cause cracking in the glass substrates (e.g., due to heating and thermal shock). Although deposited thicknesses of intermediate layer 104 may be in the range of 10-60 nm, in other examples, intermediate layer 104 may be deposited in thicknesses greater than 60 nm. Qualitatively, an intermediate layer that is too thin, e.g., too thin to absorb sufficient energy from EM radiation 108, may not allow for appropriate formation of enhanced bond 110 between first and second substrates 100, 102. An intermediate layer that is too thick, e.g., outside of a range of appropriate thickness, may cause excessive heating and thermal shock, which may result is cracking of the substrates. The selected thickness of intermediate layer 104 used to realize enhanced bond 110 may also depend, for example, on the power level of laser 106 and the type of materials selected for intermediate layer 104 and first and second substrates 100, 102.

In examples where first substrate 100 is not flat, but instead includes surface geometry, such as elevated and recessed regions, intermediate layer 104 may be deposited in a conformal layer over such surface geometry. Elevated and depressed regions on first substrate 100 may include, for example, prior deposited or etched features on first surface 112. An example conformal intermediate layer 114 which is subsequently patterned and etched is illustrated in FIGS. 5A-5B. Subsequent to deposition, in some examples, the conformally deposited intermediate layer (e.g., 104, 114) may be etched and/or polished in preparation for bonding of first and second substrates 100, 102.

In FIG. 1A, second substrate 102 is illustrated as moving towards first substrate 100, as indicated by arrows 116. Second surface 118 of second substrate 102 may be moved towards intermediate layer 104 until second surface 118 is in contact with intermediate layer 104. Second surface 118 and intermediate layer 104 may bond when brought into contact with one another. The bond, if formed, may be generally be described as a "wafer bond" or as a "direct bond." In some examples, force may be applied to second substrate 102 to press second substrate 102 (i.e., second surface 118) against intermediate layer 104 to promote bonding between second surface 118 and intermediate layer 104 (i.e., between first and second substrates 100, 102).

Formation of the direct bond may provide some adhesion between first and second substrates 100, 102 such that the bonded (i.e., direct bonded) first and second substrates 100, 102 may be handled during further processing steps without clamping first and second substrates 100, 102 together. In other examples, a direct bond may not be formed prior to directing EM radiation 108 on intermediate layer 104 to form the enhanced bond according to the present disclosure. In examples where a direct bond is not formed prior to application of EM radiation 108 to intermediate layer 104, first and second substrates 100, 104 may or may not be clamped.

Figure 6:
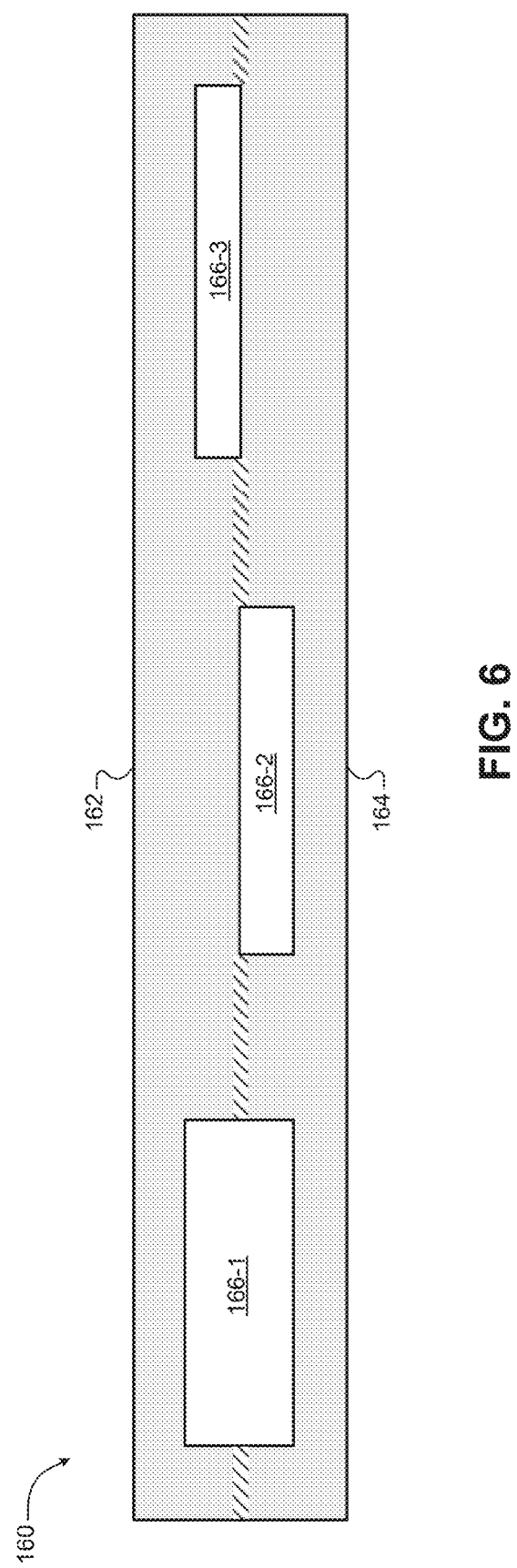
FIG. 6 shows an example stacked structure that includes a first recessed substrate and a second recessed substrate that define a plurality of cavities.
Figure 9A:
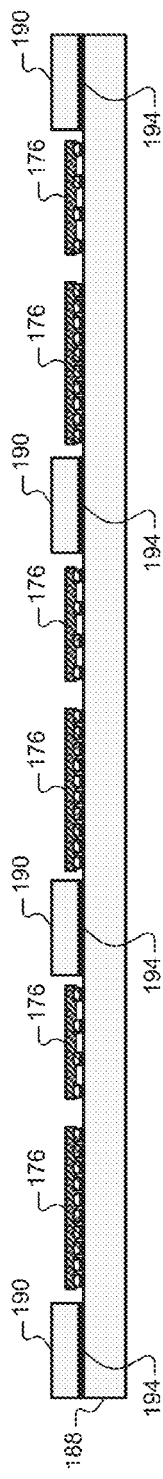
FIGS. 9A-9C illustrate an example method of forming a plurality of the packaged devices as illustrated in FIGS. 8A-8B.
Figure 9B:
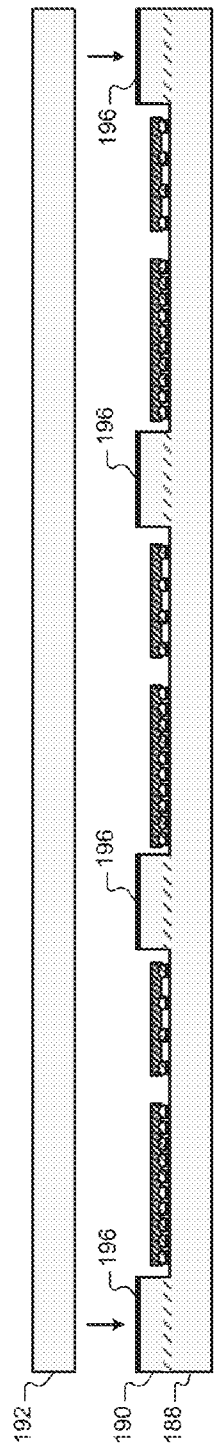
Figure 9C:
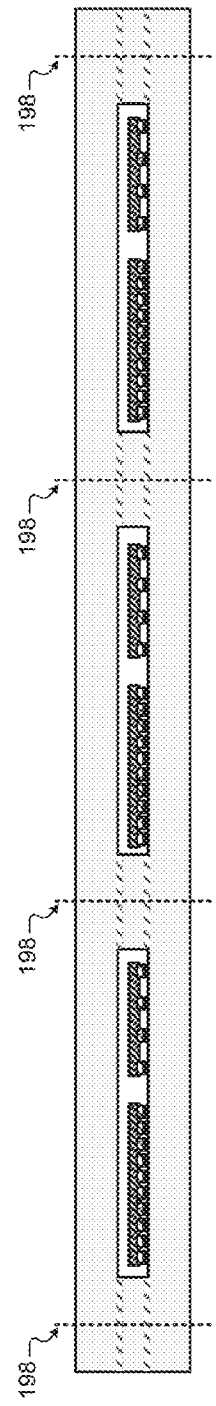

Although flat substrates are illustrated in FIGS. 1A-1C, in some examples, substrates may be bonded together such that the substrates define a plurality of cavities, as illustrated in FIG. 5C, FIG. 6 and FIG. 9C. For example, each cavity may be defined by recesses in one or both of the bonded substrates.

Figure 2:
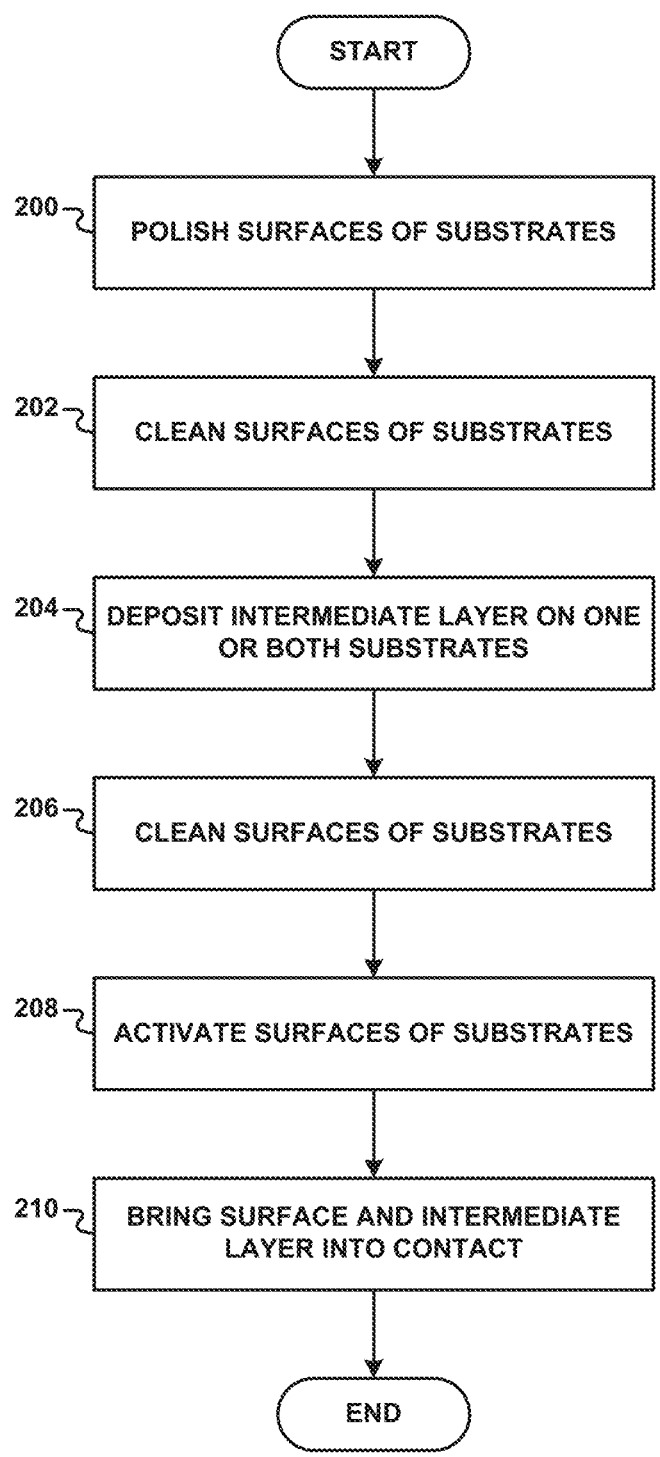
FIG. 2 shows a flowchart of an example method for preparing the first and second substrates, depositing the intermediate layer, and direct bonding the first and second substrates together.

FIG. 2 shows a flowchart of an example method for preparing first and second substrates 100, 102 for deposition of intermediate layer 104, depositing intermediate layer 104, and subsequently direct bonding first and second substrates 100, 102 together. First surface 112 and second surface 118 may be prepared by polishing to remove surface deformities such as burrs, gouges, ridges, or other irregularities (200). Different techniques may be used to polish first and second surfaces 112, 118. For example, surfaces 112, 118 may be mechanically polished, chemically polished, or treated by chemical-mechanical polishing (CMP) techniques. Surfaces 112, 118 may be polished until surfaces 112, 118 exhibit comparatively low surface roughness values in order to enhance direct bond formation. Although surfaces 112, 118 may be polished to remove irregularities, the laser bonding process according to the present disclosure may not require surfaces 112, 118 to be as smooth as surfaces used during typical wafer bonding techniques, but instead, the laser bonding process according to the present disclosure may bond first and second substrates 100, 102 together even when surfaces 112, 118 (i.e., intermediate layer 104) are relatively rough, e.g., have roughness values on the order of several microns.

Surfaces 112, 118 may then be cleaned to remove particles and contaminates from surfaces 112, 118 (202). Cleaning surfaces 112, 118 may include ultrasonic and/or megasonic cleaning. Independent of the specific techniques used, after suitably preparing surfaces 112, 118, intermediate layer 104 may be deposited on first surface 112 (204). In some examples, intermediate layer 104 may instead be deposited only on surface 118, or may be deposited on both surfaces 112, 118. Intermediate layer 104 may be deposited using a PVD process, for example. Intermediate layer 104 and surface 118 may then be cleaned (206). Intermediate layer 104 and surface 118 may then be prepared by chemical activation (208). Chemical activation may promote direct bonding between second surface 118 and intermediate layer 104. Chemical activation may involve exposing surfaces 112, 118 to a plasma (e.g., nitrogen or oxygen plasma).

Optionally, subsequent to chemical activation, intermediate layer 104 and surface 118 may be cleaned, e.g., using a megasonic rinse. Second surface 118 may then be brought into contact with intermediate layer 104 to establish a direct bond between substrates 100, 102 (210). Generally, a direct bond between substrates 100, 102 may hold substrates 100, 102 together in a substantially fixed arrangement relative to one another. Substrates 100, 102 may, in some examples, be heated (e.g., at approximately 150° C.) while held together in order to promote direct bond formation between substrates 100, 102. For example, heating may provide sufficient energy to promote some covalent bond formation.

Referring now to FIG. 1B, after second substrate 102 is brought into contact with intermediate layer 104, EM radiation 108 may be transmitted onto intermediate layer 104 through second substrate 102. Although EM radiation 108 is illustrated as a collimated beam, in some examples, instead of using a collimated beam of EM radiation 108, EM radiation may be focused onto a more localized region (i.e., a focal point) of intermediate layer 104 by using one or more mirrors and lenses, for example.

Directing EM radiation 108 onto intermediate layer 104 may heat intermediate layer 104 in the region in which EM radiation 108 is applied. The portion of EM radiation 108 absorbed by intermediate layer 104 may heat intermediate layer 104 and portions of first and second substrates 100, 104 adjacent to the heated region of intermediate layer 104. Heating of intermediate layer 104 and first and second substrates 100, 102 in the region may form an enhanced bond 110 between first and second substrates 100, 102 in the heated region.

The heat produced in intermediate layer 104 due to absorption of EM radiation 108, while producing sufficient heat to promote formation of enhanced bond 110, may not substantially heat, via conduction, portions of first and second substrates 100, 102 outside of the localized region of intermediate layer 104 receiving EM radiation 108. Accordingly, in examples where electronic components are connected to first and/or second substrates 100, 102 during application of EM radiation 108, the electronic components near the localized heated region may not be heated to a temperature that may cause damage to the electronic components. For example, when using a laser to heat intermediate layer 104, electronic components located adjacent to the heated region may be heated to no greater than 100-200° C.

Therefore, when using a laser to heat intermediate layer 104, any electronics components (e.g., a solid state battery or an integrated circuit die) near the localized heated region may not be heated to a temperature that may damage the components. This may be in contrast to other bonding techniques, such as anodic bonding, fusion bonding, or glass frit bonding. These other techniques (e.g., anodic, fusion, or glass frit bonding) may require temperatures ranging from 400 to 900° C., which may damage some electronic components.

In some examples, when using the laser bonding process of the present disclosure, intermediate layer 104 may be heated to greater temperatures (e.g., greater than 100-200° C.), but the portions of intermediate layer 104 and first and second substrates 100, 102 adjacent to the heated region may not be heated to such temperatures since the heating may be localized at the point on intermediate layer 104 that receives EM radiation 108. Furthermore, when first and second substrates 100, 102 include insulating material, e.g., when first and second substrates 100, 102 are glass substrates, electronic components connected to first and/or second substrates 100, 102 may be further insulated from heating since glass substrates may be thermally insulating. Such a low temperature processes performed on insulating substrates may allow for arrangement of electronic components close to the heated region, and therefore may allow for more compact and flexible component layout options relative to other available packaging options using higher temperature processing.

EM radiation 108 emitted onto intermediate layer 104 may be applied according to various parameters. Parameters of EM radiation 108 applied to intermediate layer 104 may include the wavelength or range of wavelengths of radiation included in EM radiation 108, the power/area of radiation applied, and the amount of time for which EM radiation 108 is applied.

As described above, the wavelength(s) of EM radiation applied to intermediate layer 104 may be selected based on the optical properties of first substrate 100, second substrate 102, and intermediate layer 104. Generally, the wavelength(s) of EM radiation applied to intermediate layer 104 may be selected such that first and second substrates 100, 102 are transparent to the selected wavelength(s), while intermediate layer 104 absorbs the selected wavelength(s). For example in a structure comprising an amorphous silicon intermediate layer sandwiched between two glass substrates, the wavelength of EM radiation 108 may be selected to be approximately 1070 nm (+/−10 nm) which may be transmitted through the glass substrates and sufficiently absorbed by the amorphous silicon layer. Although the absorption of 1070 nm light in Si may be less than 35% at room temperature, this absorption level may be sufficient for the laser bonding process.

The power level (e.g., Watts or Watts per square meter) of EM radiation 108 applied to intermediate layer 104 may also be selected based on various considerations. In some examples, a threshold power of EM radiation 108 may be selected based on a minimum amount of power that is sufficient to heat intermediate layer 104 to form enhanced bond 110 between first and second substrates 100, 102. For example, the threshold power may be based on the material(s) used as intermediate layer 104, as differing material properties may require different power levels in order to heat sufficiently to form enhanced bond 110. In some examples, the threshold power may be selected based on the thickness of intermediate layer 104. An intermediate layer having a greater thickness may require a lower power of EM radiation to be selected since the thicker intermediate may absorb a greater percentage of the incident radiation. In contrast, thinner intermediate layers may require a greater laser wattages for heating since much of the laser energy may be transmitted through thinner films.

In some examples, EM radiation 108 may be applied to intermediate layer 104 for a predetermined period of time, which may be based on the power level of EM radiation 108 and the types of materials used for intermediate layer 104 and first and second substrates 100, 102. For example, the predetermined period of time may be relatively longer when EM radiation 108 is applied at a lower power level, second substrate 102 is less transparent to the particular wavelength of EM radiation 108, and intermediate layer 104 is relatively thicker. The predetermined period of time may be relatively shorter when EM radiation 108 is applied at a relatively higher power level, second substrate 102 is more transparent to the wavelength of EM radiation 108, and intermediate layer 104 is thinner.

Upon initial exposure to EM radiation 108, intermediate layer 104 may absorb a portion of EM radiation 108. The portion of EM radiation 108 that is not absorbed by intermediate layer 104 may be reflected (not shown in FIG. 1B) by intermediate layer 104 and/or transmitted through intermediate layer 104 (e.g., transmitted radiation 120). Intermediate layer 104 may continue to absorb a portion of EM radiation 108 for a period of time after initial exposure to EM radiation 108. After the period of time, the region of intermediate layer 104 on which EM radiation 108 is directed may change in composition. For example, after a period of heating, the region heated by EM radiation 108 may no longer comprise three distinct layers of material (e.g., substrate/intermediate layer/substrate) as present prior to heating by EM radiation 108. In other words, after a period of time, the region heated may not comprise a continuous intermediate layer 104 (e.g., 10-60 nm in thickness) sandwiched between first and second substrates 100, 102. Instead, heating in the region receiving EM radiation 108 may cause an enhanced bond to form between first and second substrates 100, 102.

Enhanced bond 110 formed between first and second substrates 100, 102 in the region heated by EM radiation 108 may present different optical properties than regions of intermediate layer 104 not heated by EM radiation 108. For example, at least one of transmission, reflection, and absorption in the region of enhanced bond 110 may be altered. The portion of EM radiation 108 typically absorbed by intermediate layer 104 upon initial exposure to EM radiation 108 may be transmitted through enhanced bond 110 upon formation of enhanced bond 110. Accordingly, the magnitude of the portion of EM radiation 108 absorbed by intermediate layer 104 may decrease upon formation of enhanced bond 110. In some examples, the amount of EM radiation 108 that may be reflected from intermediate layer 104 may also differ from enhanced bond 110.

Figure 3A:
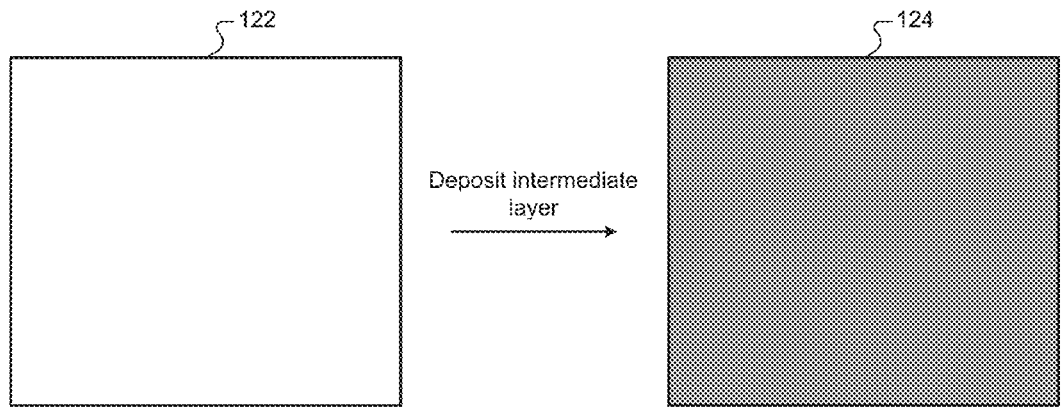
FIGS. 3A-3B show example optical properties of the first and second substrates and intermediate layer observed during the laser bonding process.
Figure 3B:
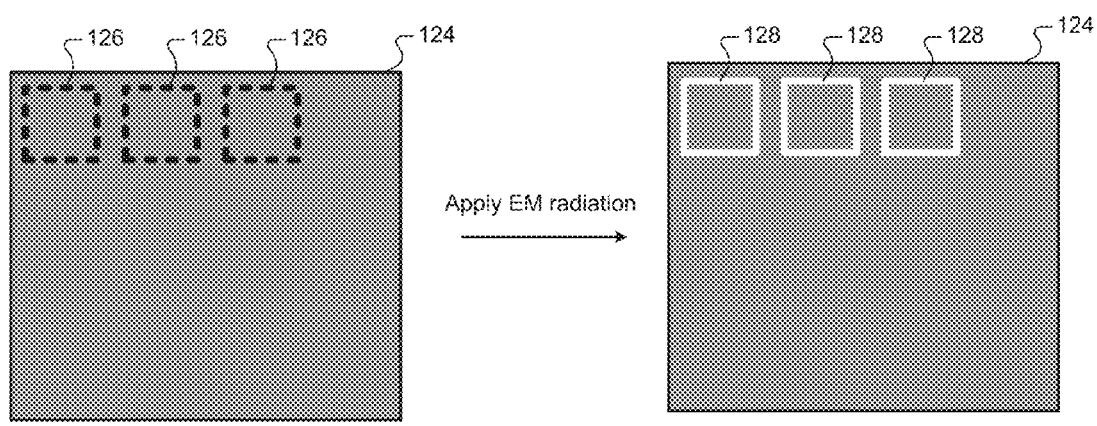

FIGS. 3A-3B illustrate example optical properties observed during the laser bonding process according to the present disclosure. The optical properties illustrated in FIGS. 3A-3B represent optical properties observed in the visible spectrum (e.g., wavelengths of 390-750 nm). The example illustrated in FIGS. 3A-3B may be representative of a scenario where first and second substrates 100, 102 are glass substrates (e.g., borosilicate glass) and intermediate layer 104 is a layer of amorphous silicon (e.g., 10-60 nm thick).

In FIG. 3A, a first glass substrate 122 is illustrated as colorless and transparent in the visible spectrum. FIG. 3A also illustrates a stacked structure 124 comprising an amorphous silicon intermediate layer deposited between first glass substrate 122 and a second glass substrate. In stacked structure 124, the intermediate layer may comprise a thin film of amorphous silicon. Such a thin film may present a tinted appearance when viewed in the visible spectrum. For example, the tinted appearance may be due to at least one of reflective, transmissive, and absorption properties of the amorphous silicon layer in the visible spectrum. The darkness of the tinted appearance may vary depending on the thickness of the amorphous silicon layer.

The color exhibited by an amorphous silicon intermediate layer may depend on the thickness of the layer. For example, the color of a film may appear in the yellow-orange portion of the visible spectrum when the films are less than 50 nm. This color may transition to the red-orange spectrum when the film is greater than 50 nm thick. Those films in the 20-60 nm range may appear tinted, but still see-through, to the eye. After laser treatment, the color and tint of the area treated may be lost, and therefore under normal room lighting, the treated area may appear colorless, or without tint, and transparent.

The shading of stacked structure 124 illustrated in FIGS. 3A-3B is for illustration purposes only. In other words, the shading of FIGS. 3A-3B merely illustrate that a deposited film of amorphous silicon between two glass substrates presents a tint that would not otherwise be observed if the amorphous silicon layer was not present between the glass substrates.

EM radiation 108 may be directed onto stacked structure 124, e.g., EM radiation 108 may be transmitted through one of the glass substrates of stacked structure 124 and onto the amorphous silicon intermediate layer of stacked structure 124. The dotted lines 126 in FIG. 3B illustrate a pattern traced by EM radiation 108. Accordingly, dotted lines 126 of FIG. 3B illustrate regions of stacked structure 124 in which enhanced bonds will be formed.

Figure 10:
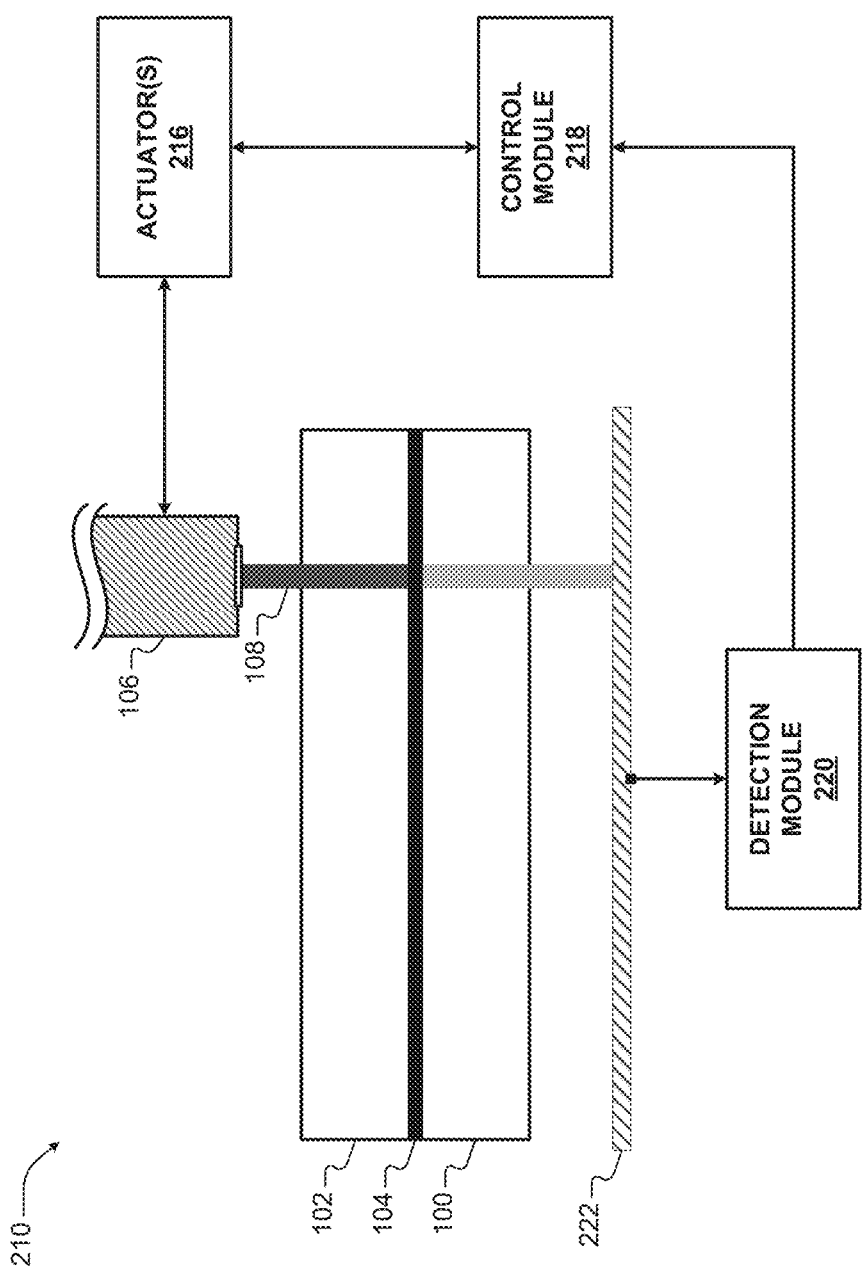
FIG. 10 illustrates an example fabrication system that may be used to form an enhanced bond between the first and second substrates.
Figure 12:
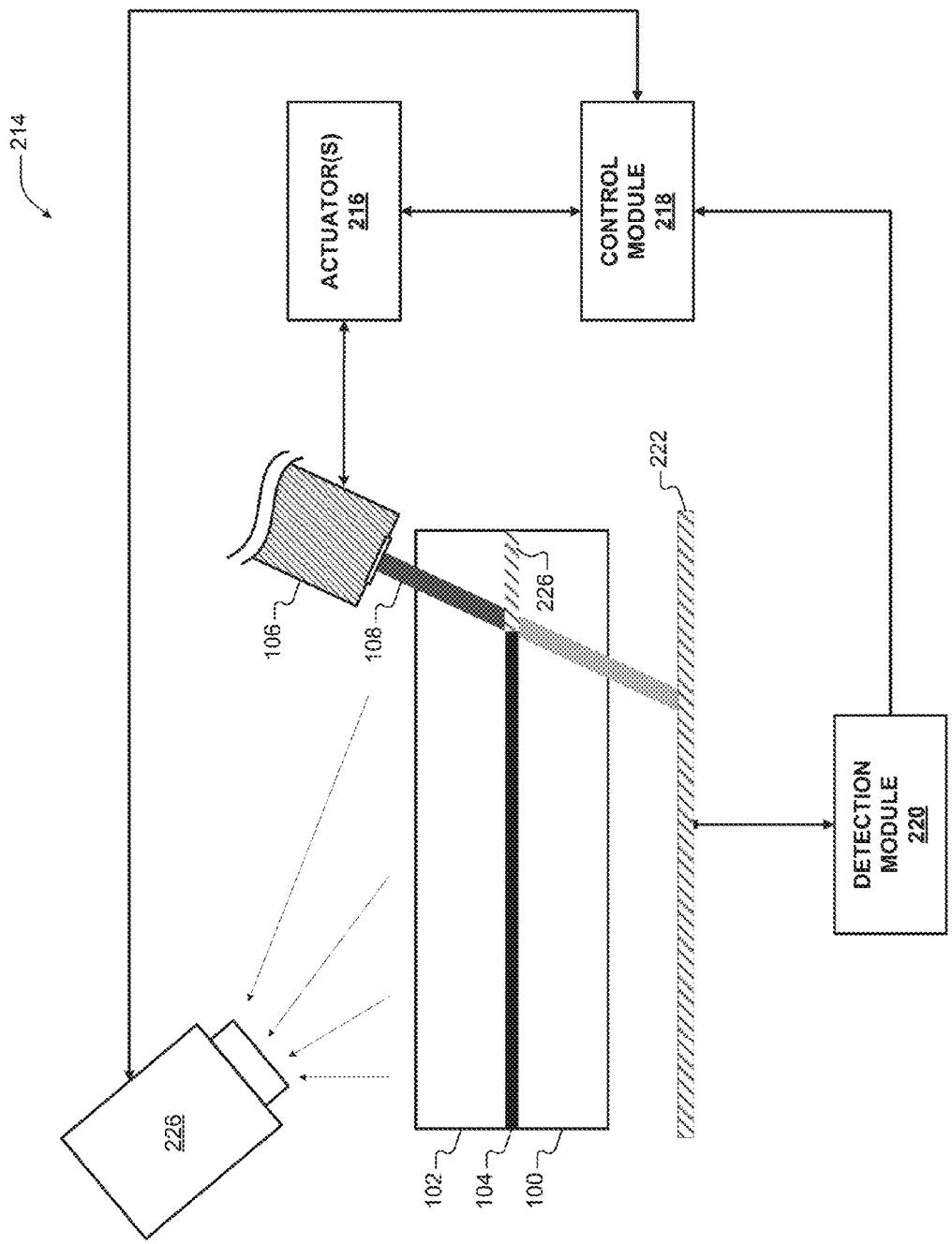
FIG. 12 illustrates an example fabrication system that includes an inspection camera.

Stacked structure 124 shown on the right in FIG. 3B illustrates regions of stacked structure 124 including enhanced bonds between the two glass substrates using white lines 128. White lines 128 illustrate the optical properties (e.g., in the visual spectrum) of the regions including enhanced bonds. In the visible spectrum, the enhanced bonds may appear colorless, rather than tinted with color as in the areas that have not been laser treated. In other words, the change in optical properties of the region treated with EM radiation 108 is manifested, in one example, as a transition from a tinted appearance in stacked structure 124 to a colorless or clear appearance. In some examples, processing systems may be implemented, as illustrated in FIGS. 10-12, that determine when an enhanced bond has been formed based on an amount of light emitted through the enhanced bonding region. In some examples, as illustrated in FIG. 12, processing systems may also be implemented that inspect enhanced bonding regions based on the transparent nature of an appropriately formed enhanced bonding region.

Although inspection and optical characterization of enhanced bonds are described above with respect to the visible spectrum, it is contemplated that a similar change in optical properties, e.g., a transition from opacity to transparency, may occur in the region of the enhanced bonds in wavelengths other than the visible spectrum.

Referring back to FIG. 1C, an enhanced bond 110 formed between first and second substrates 100, 102 is illustrated. Enhanced bond 110 is formed in the region of intermediate layer 104 that is exposed to EM radiation 108. FIG. 1C also illustrates that an enhanced bond transmits a relatively greater portion of EM radiation 108 than intermediate layer 104. For example, note that the portion of EM radiation 108 transmitted through first substrate 100 in FIG. 1B is illustrated using a lighter shading than EM radiation 108 transmitted through first substrate 100 in FIG. 1C to illustrate the additional absorption of some of EM radiation 108 by intermediate layer 104 in FIG. 1B. Such absorption is decreased, as illustrated in FIG. 1C, when an enhanced bond is formed.

FIGS. 1B-1C illustrate formation of enhanced bond 110 at a single position, i.e., a single position of EM radiation 108. In other words, formation of an enhanced bond at a single point between first and second substrates 100, 102. FIGS. 4A-4D illustrate using laser 106 to form various enhanced bonds arranged along a length of a substrate as opposed to a single point.

FIG. 4A illustrates an enhanced bond 130 formed along a length of first and second substrates 100, 102. Enhanced bond 130 is illustrated as a hashed region between first and second substrates 100, 102. Intermediate layer 104 deposited on first substrate 100, which is untreated by EM radiation 108, is illustrated as a darkened region, similar to FIGS. 1A-1C. As illustrated in FIG. 4A, laser 106 moves from a first position 132 to a second position 134, and continuously applies EM radiation 108 along a length of intermediate layer 104. For example, laser 106 may be actuated such that EM radiation 108 traces a path along intermediate layer 106. Laser 106 may be actuated such that EM radiation 108 impinges on intermediate layer 104 and causes enhanced bond 130 to form along the path traced by EM radiation 108. The rate of movement of laser 106, and therefore EM radiation 108, may be selected such that as EM radiation 108 is moved, EM radiation 108 is directed at intermediate layer 104 for a sufficient amount of time to cause enhanced bond 130 to form.

As illustrated in FIG. 4A, when laser 106 is in second position 134, EM radiation 108 is directed at a portion of intermediate layer 104 that is currently being heated to form an enhanced bond. A portion of EM radiation 108 in the second position 134 is absorbed, and accordingly, the portion of EM radiation 108 transmitted through first substrate 100 has an intensity that is less than EM radiation 108 emitted from laser 106.

FIG. 4B illustrates a plurality of separate enhanced bonds 136 along a length of first and second substrates 100, 102. A plurality of intermediate layers 138 deposited on first substrate 100, which are untreated by EM radiation 108, are illustrated as darkened regions, similar to FIGS. 1A-1C.

FIG. 4B shows that an intermediate layer need not be one continuous layer, but instead may be selectively patterned on different regions of first surface 112. Disconnected intermediate layers 138 in FIG. 4B may be fabricated using various techniques. In one example, disconnected intermediate layers 138 may have been originally deposited (e.g., using PVD) as a single layer which was selectively etched (e.g., using a patterning process such as a photolithographic/etching process) to produce disconnected intermediate layers 138.

Similar to FIG. 4A, laser 106 may be moved from first position 132 to second position 134 to form enhanced bonds 136. As laser 106 moves from first position 132 to second position 134, laser 106 may continuously apply EM radiation 108 along a length of first and second substrates 100, 102, and therefore may heat disconnected intermediate layers and transform disconnected intermediate layers into enhanced bonding regions 136. Disconnected intermediate layers 138 may have thicknesses similar to that of intermediate layer 104 described above, e.g., 10-60 nm in some examples.

Figure 4C:
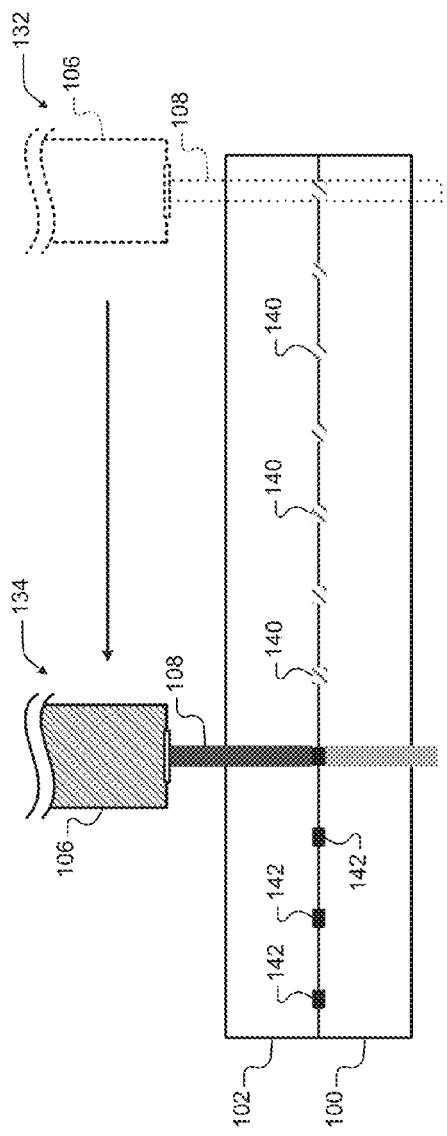
FIG. 4C shows another example of a plurality of separate enhanced bonds along a length of the first and second substrates.

FIG. 4C illustrates another example of a plurality of separated enhanced bonds 140 along a length of first and second substrates 100, 102. A plurality of intermediate layers 142 deposited on first substrate 100, which are untreated by EM radiation 108, are illustrated as darkened regions, similar to FIGS. 1A-1C. In the example of FIG. 4C, the width of deposited intermediate layers 142 and the width of EM radiation 108 (e.g., the width of the collimated beam) may be selected such that EM radiation 108 may heat the entire width of intermediate layers 142. Accordingly, in examples where intermediate layer width is selected such that the width of intermediate layers is approximately equal to, or less than, the width of EM radiation 108, laser 106 may form an enhanced bond by tracing (e.g., into and out of the paper) a single line over the intermediate layers.

Figure 4D:
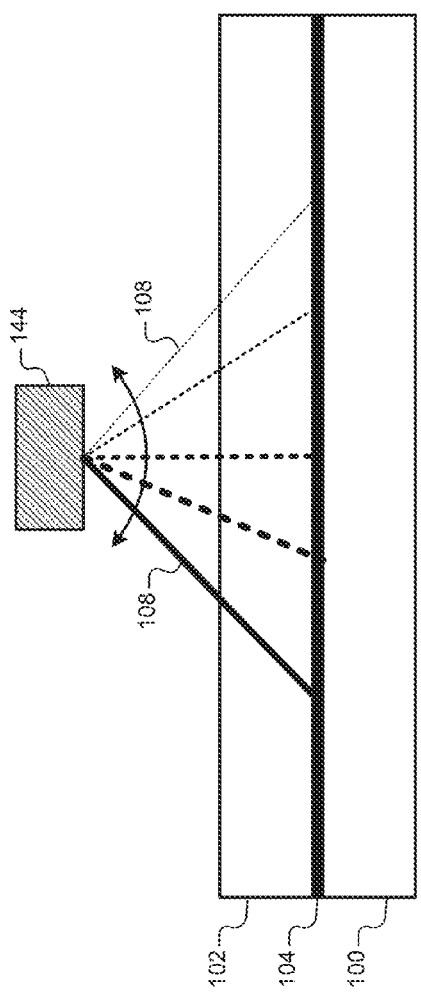
FIG. 4D shows a scanning laser system that scans a laser beam across an intermediate layer in a repetitive fashion to produce an enhanced bond.

FIG. 4D includes a scanning laser system 144. Scanning laser system 144 represents one or more devices that may be implemented to produce a laser beam, and scan the produced laser beam across intermediate layer 104 in a repetitive or rastering fashion. For example, scanning laser system 144 may include a source of EM radiation 108 (e.g., a laser), optics, and actuators, that cause EM radiation 108 to scan back and forth along a length of intermediate layer 104. Scanning system 144 may produce EM radiation 108 that heats a larger area of intermediate layer 104 than a single source of EM radiation 108 (e.g., a single beam) that is not scanned. The portion of intermediate layer 104 that absorbs EM radiation 108 may be heated, and subsequently may produce an enhanced bond between first and second substrates 100, 102.

FIGS. 5A-5C illustrate bonding planar substrate 146 to recessed substrate 148 to form cavities 150 defined by planar and recessed substrates 146, 148. Initially, recessed substrate 148 defines recessed regions 152 in recessed substrate 148. Intermediate layer 114 (e.g., amorphous silicon) is deposited in a conformal layer over recessed substrate 148. Next, intermediate layer 114 may be patterned, e.g., using photo-lithographic/etching techniques to define separate intermediate layers 154-1, 154-2, 154-3, 154-4 (collectively intermediate layers 154). The separate intermediate layers 154 illustrated in FIGS. 5B-5C are deposited on ridges of recessed substrate 148 that define recessed regions 152. Portions of intermediate layer 114 of FIG. 5A have been removed (e.g., etched) from recessed regions 152 in FIG. 5B. Additionally, in some examples, as illustrated at 154-2, portions of intermediate layer 114 on ridges of recessed substrate 148 may be etched in addition to the portions of intermediate layer 114 etched from recessed regions 114.

Using arrows 156, FIG. 5B illustrates planar substrate 146 being placed in contact with intermediate layers 154 on ridges of recessed substrate 148. After placing planar substrate 146 in contact with intermediate layers 154, EM radiation may be directed onto intermediate layers 154 to form enhanced bonds between planar and recessed substrates 146, 148. Since enhanced bonds according to the present disclosure may form hermetic seals, enhanced bonds 158 of FIG. 5C may form hermetic seals between cavities 150 defined by planar and recessed substrates 146, 148. In some examples, a single packaged device may comprise two separate cavities, each of the cavities housing different electronic components which are separated by hermetic seals. For example, one cavity may include a battery, while the other cavity may include processing circuitry.

FIG. 6 illustrates an example stacked structure 160 that includes a first recessed substrate 162 and a second recessed substrate 164 that define a plurality of cavities 166-1, 166-2, 166-3. First and second recessed substrates 162, 164 are bonded together by enhanced bonds. FIG. 6 illustrates that cavities may be defined by substrates in a variety of ways. In one example, cavities (e.g., cavities 166-2, 166-3) may be defined by a recessed region in one substrate and a flat region on another substrate. In another example, a single cavity (e.g., cavity 166-1) may be defined by recessed regions on separate substrates that meet to define the single cavity.

Figure 7A:
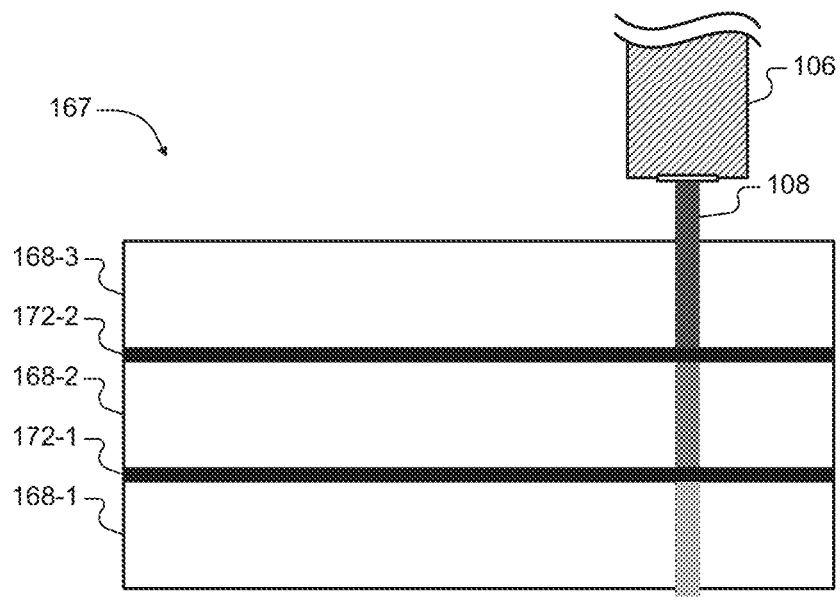
FIGS. 7A-7B illustrate using the laser bonding process to fabricate a stack of three substrates connected together by enhanced bonds.
Figure 7B:
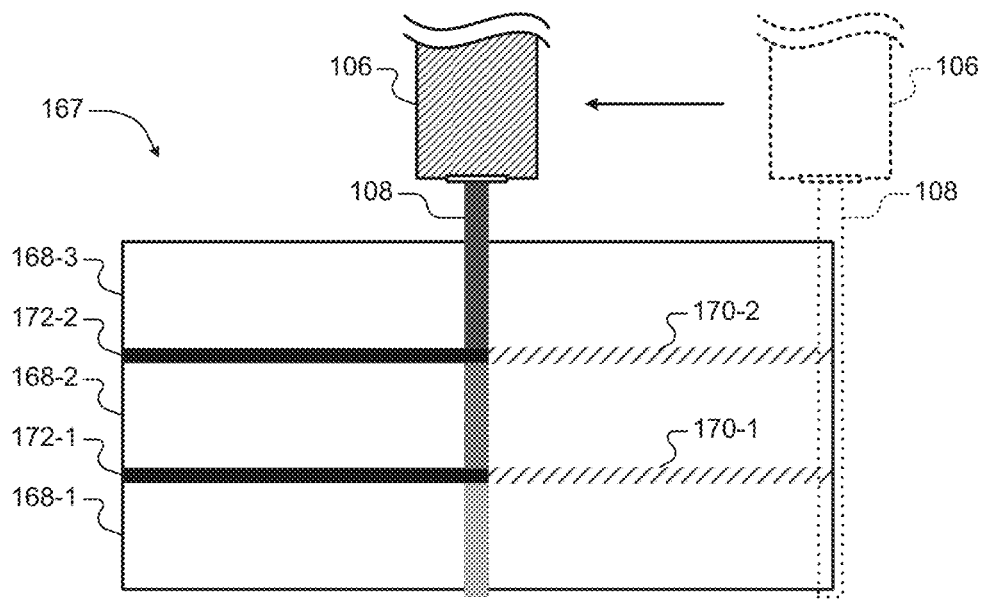

FIGS. 7A-7B illustrate using the laser bonding process of the present disclosure to fabricate a stack 167 of three substrates 168-1, 168-2, 168-3 connected together by enhanced bonds 170-1, 170-2. Substrates 168-1, 168-2, 168-3 may include similar materials as substrates 100, 102 described above. For example, substrates 168-1, 168-2, 168-3 may be glass substrates (e.g., borosilicate glass). Intermediate layer 172-1 may be a layer (e.g., amorphous silicon) deposited on substrate 168-1 and/or substrate 168-2. Intermediate layer 172-2 may be a layer (e.g., amorphous silicon) deposited on substrate 168-2 and/or substrate 168-3. In some examples, substrates 168-1, 168-2, 168-3 may be directly bonded together (i.e., wafer bonded), as described above. EM radiation 108 may then be directed onto intermediate layers 172-1, 172-2 until enhanced bonds 170-1, 170-2 are formed between substrates 168-1, 168-2, 168-3.

Various techniques may be used to form enhanced bonds in stack 167. EM radiation 108 may be transmitted through both intermediate layers 172-1, 172-2 at the same time to form enhanced bonds 170-1, 170-2 between substrates 168-1, 168-2 and substrates 168-2, 168-3. For example, a first portion of EM radiation 108 may be absorbed by intermediate layer 172-2, while a second portion of EM radiation 108 may be transmitted through substrate 168-2. This second portion of EM radiation 108 may then be absorbed by intermediate layer 172-1. The remaining EM radiation not absorbed in intermediate layer 172-1 may be transmitted through substrate 168-1 and exit stack 167.

EM radiation 108 absorbed by intermediate layers 172-1, 172-2 may sufficiently heat intermediate layers 172-1, 172-2, and surrounding portions of substrates 168-1, 168-2, 168-3 such that enhanced bonds 170-1, 170-2 form between substrates 168-1, 168-2, 168-3 in the regions heated by the EM radiation. In other words, the power level of EM radiation 108 transmitted through intermediate layer 172-2 may be sufficient to allow for absorption and heating of intermediate layer 172-1 such that intermediate layer 172-1 also forms an enhanced bond.

As illustrated in FIGS. 7A-7B, EM radiation 108, emitted from laser 106, may form a collimated beam. Even though EM radiation 108 may not be focused on either of intermediate layers 172-1, 172-2, EM radiation 108 may still produce a sufficient amount of heating in intermediate layers 172-1, 172-2 to form an enhanced bond between both substrates 168-1, 168-2 and substrates 168-2, 168-3.

In the laser bonding process according to the present disclosure, most of the energy transmitted from laser 106 may be transmitted through an intermediate layer. In some examples, greater than 90% of the energy may be transmitted through a single intermediate layer, which allows for simultaneous production of a plurality of enhanced bonds between substrates, as is illustrated in FIG. 7B.

In other examples, instead of emitting a collimated EM radiation 108, EM radiation may be focused onto second intermediate layer 172-2, such that energy is absorbed by second intermediate layer 172-2 in a more localized region (i.e., a focal point). In this example, an enhanced bond may form at a more localized region between substrates 168-2, 168-3, however, due to the focus of the EM radiation, an enhanced bond may not form between substrates 168-1, 168-2 since intermediate layer 172-1 may not receive a threshold amount of energy to form an enhanced bond. In examples where EM radiation is focused onto second intermediate layer 172-2, laser 106 may be actuated to trace second intermediate layer 172-2 until an enhanced bond is formed between substrates 168-2, 168-3. Then, subsequent to formation of this enhanced bond, EM radiation may be refocused onto first intermediate layer 172-1 and scanned along first intermediate layer 172-1 to form an enhanced bond between substrates 168-1, 168-2.

Although bonding of three substrates 168-1, 168-2, 168-3 is illustrated, the laser bonding process according to the present disclosure may be used to bond more than three substrates together simultaneously, using similar processes as described above with reference to FIGS. 7A-7B. For example, four or more substrates may be bonded together simultaneously. Additionally, in examples where EM radiation is refocused, greater than three substrates may be bonded together.

FIGS. 8A-8B illustrate a packaged device 174 including electronic components 176. Electronic components 176 are illustrated as integrated circuits (ICs) including bonding pads and solder bumps. Although illustrated as ICs, electronic components 176 included within cavity 178 of packaged device 174 are not limited to ICs attached to substrates using bonding pads and solder bumps. For example, electronic components 176 may represent other devices, such as devices fabricated directly onto one of the substrates of packaged device 174. Furthermore, although not shown, the substrate on which electronic components 176 are attached may include conductive interconnects that connect electronic components 176. Electronic components 176 of the present disclosure may include, but are not limited to, components such as IC dice (e.g., analog and digital circuits), sensors (e.g., accelerometers, gyroscopic sensors), energy storage devices (e.g., batteries and capacitors), and communication components (e.g., an antenna). In some examples, packaged device 174 may include one or more vias that extend from an inside of packaged device 174, through one or more substrates of packaged device 174, and to an outside surface of packaged device 174. In these examples, electronic components 176 within packaged device 174 may sense physiological electrical signals through the vias and/or provide electrical therapy to a patient through the vias.

Packaged device 174 may be fabricated from three separate substrates, a bottom substrate 180, a spacer substrate 182, and a top substrate 184. FIG. 8A shows a cross sectional side view of packaged device 174, illustrating spacer substrate 182 in two separate sections. FIG. 8B shows packaged device 174 with top substrate 184 removed. Although spacer substrate 182 appears to include two separate portions in FIG. 8A, as illustrated in FIG. 8B, spacer substrate 182 is a single substrate that defines a window. Electronic components 176 are disposed within cavity 178 defined by substrates 180, 182, 184, i.e., within the window defined by spacer substrate 182.

Substrates 180, 182, 184 are bonded together with enhanced bonds 186. Substrates 180, 182, 184 may be bonded together in a variety of different ways. In one example, Electronic components 176 may be attached to bottom substrate 180, and then spacer substrate 182 may be bonded, using an enhanced bond, to bottom substrate 180. Subsequently, top substrate 184 may be bonded, using an enhanced bond, to spacer substrate 182. In this example, prior to forming enhanced bonds 186 between substrates 180, 182, 184, intermediate layers may be deposited on any of the surfaces of substrates 180, 182, 184.

In another example, electronic components 176 may be attached to bottom substrate 180, and subsequently, top substrate 184 and spacer substrate 182, already connected with an enhanced bond, may be placed over top of electronic components 176. Subsequently, the combined top substrate 184 and spacer substrate 182 may be bonded to bottom substrate 186. For example, EM radiation may be transmitted through the enhanced bonds connecting top substrate 184 and spacer substrate 182 and onto an intermediate layer between spacer substrate 182 and bottom substrate 180.

In still other examples, bottom substrate 180 and spacer substrate 182 may first be bonded together using an enhanced bond. Subsequently, electronic components 176 may be attached to bottom substrate 180 through the window defined by spacer substrate 182. Finally, top substrate 184 may be bonded to spacer substrate 182 using the laser bonding process of the present disclosure.

The width of an enhanced bond, illustrated at 181, may be variable, based on the focus of the EM radiation and a number of passes of the EM radiation used to form the enhanced bond. For example, the width of an enhanced bond due to a single pass of EM radiation may roughly correspond to the focused spot size of the laser system employed. However, with multiple passes of the laser, the edges of the enhanced bonds formed during each pass may overlap, so the width of a final enhanced bond may only be limited by the sample dimensions (e.g., the width of the deposited intermediate layer). Accordingly, various dimensions of enhanced bond may be produced by selecting the focus of the EM radiation and the number of passes of the EM radiation over the intermediate layer.

FIGS. 9A-9C illustrate a method of forming a plurality of packaged devices 174 as illustrated in FIGS. 8A-8B, using a bottom wafer 188, a spacer wafer 190, and a top wafer 192.

Bottom wafer 188, spacer wafer 190, and top wafer 192 may be diced after formation of enhanced bonds using EM radiation in order to form a plurality of packaged devices 174.

In FIG. 9A, electronic components 176 may be attached to bottom wafer 188 (e.g., borosilicate glass wafer), and spacer wafer 190 may be bonded (e.g., wafer bonded) to bottom wafer 188. Intermediate layer 194 may be deposited onto bottom wafer 188 before or after attachment of electronic components 176 to bottom wafer 188. In other examples, intermediate layer 194 may be deposited onto spacer wafer 190. In still other examples, intermediate layer 194 may have been deposited onto both bottom wafer 188 and spacer wafer 190. EM radiation may then be directed onto intermediate layer 194 of FIG. 9A, e.g., directed through spacer wafer 190 and onto intermediate layer 194.

As illustrated in FIG. 9B, intermediate layer 196 may be deposited on spacer wafer 190, and top wafer 192 may be placed over spacer wafer 190. Additionally, or alternatively, an intermediate layer may be deposited on top wafer 192 before interfacing top wafer 192 with spacer wafer 190. EM radiation may then be directed at intermediate layer 196 to form an enhanced bond between spacer wafer 190 and top wafer 192. Although enhanced bonds formed between wafers 188, 190, 192 are illustrated and described as being formed sequentially, e.g., between bottom wafer 188 and spacer wafer 19 and then between spacer wafer 190 and top wafer 192, in other examples, wafers 188, 190, 192 may be bonded together (e.g., wafer bonded) and then EM radiation may be directed through all three wafers 188, 190, 192 to form enhanced bonds. In other words, EM radiation may be directed through the stack of wafers 188, 190, 192 to form enhanced bonds between wafers 188, 190, 192 simultaneously. In reference to FIG. 9C, top wafer 192 and spacer wafer 190 may at least partially define a plurality of enclosed cavities, and spacer wafer 190 and bottom wafer 188 may at least partially define a plurality of the enclosed cavities.

FIG. 9C illustrates locations 198 in which the stack of wafers 188, 190, 192 may be cut (e.g., diced) to form separate packaged devices 174 as illustrated and described with respect to FIGS. 8A-8B. The stack of wafers 188, 190, 192 may be diced using a dicing saw for example. Although only 3 separate packaged devices are illustrated in FIG. 9C, the number of packaged devices produced from cutting a stack of wafers may be much greater, and may depend on the size of the wafers used and size of the packaged devices fabricated.

Although not illustrated in FIGS. 8A-8B, and FIGS. 9A-9C, one or more conductive vias may extend from the cavities 178 to an external surface of the packaged devices 174. Such conductive vias may provide for electrical connection to electronic components 176 housed within cavities 178. Example packaged devices including example electronic components are described in U.S. Pat. No. 8,708,483, filed on Oct. 26, 2010 and entitled "Wafer-scale Package Including Power Source", which is incorporated herein by reference in its entirety.

FIGS. 10-12 illustrate fabrication and inspection systems that may perform the laser bonding process according to the present disclosure. FIGS. 10-12 show functional block diagrams of example fabrication systems 210, 212, 214 including modules that represent functionality that may be included in fabrication systems 210, 212, 214 according to the present disclosure. Modules included within fabrication systems 210, 212, 214 may include any discrete and/or integrated electronic circuit components that implement analog and/or digital circuits capable of producing the functions attributed to the modules herein. For example, the modules may include analog circuits, e.g., amplification circuits, filtering circuits, and/or other signal conditioning circuits. The modules may also include digital circuits, e.g., combinational or sequential logic circuits, memory devices, etc. Memory may include any volatile, non-volatile, magnetic, or electrical media, such as a random access memory (RAM), read-only memory (ROM), non-volatile RAM (NVRAM), electrically-erasable programmable ROM (EEPROM), Flash memory, or any other memory device. Furthermore, memory may include instructions that, when executed by one or more processing circuits, cause the modules to perform various functions attributed to the modules herein.

The functions attributed to the modules herein may be embodied as hardware, firmware, software, or any combination thereof. Depiction of different features as modules is intended to highlight different functional aspects and does not necessarily imply that such modules must be realized by separate hardware or software components. Rather, functionality associated with one or more modules may be performed by separate hardware or software components, or integrated within common or separate hardware or software components.

FIG. 10 illustrates an example fabrication system 210 that may be used to form an enhanced bond between two substrates 100, 102. Fabrication system 210 includes laser 106, one or more actuators 216, a control module 218, a detection module 220, and a sensor 222.

Actuators 216 may control the position of laser 216, and therefore the position of EM radiation 108. For example, actuators 216 may control rotation and translation of laser 106. Actuators 216 may include electronics and actuating devices, such as electric motors, in order to control the position of laser 106. In some examples, actuators 216 may control a motorized stage on which substrates 100, 102 are placed. In this example, actuators may control rotation and translation of the stage to position substrates 100, 102 relative to EM radiation 108. Actuators 216 may also receive feedback (e.g., servo feedback) from motors controlling laser 106 and/or the stage, and determine the position of the EM radiation 108 based on the feedback. In some examples, actuators 216 may control a power level of laser 106, and a mode of operation of laser 106, e.g., continuous or pulsed.

Sensor 222 represents an instrument that may generate signals, e.g., voltage and/or current signals, based the power of EM radiation incident on sensor 22. EM radiation incident on sensor 222 may be the portion of EM radiation 108 not absorbed by intermediate layer 104 or, in some examples, EM radiation may be generated by the heating of intermediate layer 104. Detection module 220 determines an amount of EM radiation transmitted through the stack of substrates 100, 102 based on the signals generated by sensor 222. For example, detection module 220 may include signal amplification, filtering, and analog-to-digital conversion hardware that determines an amount of EM radiation incident on sensor 222.

Control module 218 may control the position of EM radiation 108 (i.e., laser 106) based on at least one of a processing program, data received from detection module 220, and data received from actuators 216. Control module 218 may instruct actuators 216 in order to control the position of laser 106. In some examples, control module 218 may control actuators 216, and therefore the position of EM radiation 108 on intermediate layer 104, based solely on the processing program in systems that do not include sensor 222 and detection module 220. In these examples, the processing program may define a predetermined path of laser 106 and a predetermined amount of time for exposure of intermediate layer 104 to EM radiation 108. For example, control module 218, under control of the processing program, may control a "feed rate" at which laser 106 is moved, where the rate of motion of laser 106 is selected such that intermediate layer 104 is sufficiently heated by EM radiation 108 to form an enhanced bond before laser 106 is moved on to expose another portion of intermediate layer 104 to EM radiation 108. A feed rate may be on the order of 10-25 mm per second.

In other examples, control module 218 may control actuators 216 to move laser 106 based on data received from detection module 220. Since the amount of EM radiation transmitted through intermediate layer 104 may indicate whether an enhanced bond has been formed in the heated region of intermediate layer 104, data generated by detection module 220 may indicate whether an enhanced bond is formed at the current position of laser 106. Control module 218 may therefore determine, based on data received from detection module 220, when an enhanced bond is formed. Based on such data, control module 218 may move laser 106 from a present position after determining that an enhanced bond is formed at the present position of laser 106. For example, control module 218 may actuate laser 106 to change position when control module 218 determines, based on data received from detection module 220, that the amount of EM radiation incident on sensor 22 indicates that an enhanced bond is formed at the present position of laser 106.

FIG. 11 illustrates another example fabrication system 212. Fabrication system 212 includes a reflection sensor 224 that detects EM radiation that is reflected off of intermediate layer 104 and/or enhanced bond 226. Similar to fabrication system 210 of FIG. 10, detection module 220 may determine an amount of EM radiation incident on reflection sensor 224, and control module 218 may actuate laser 106 based on the detected EM radiation. In some examples, the amount of EM radiation reflected from intermediate layer 104 may vary during formation of an enhanced bond. Depending on the material used for intermediate layer 104, initially, intermediate layer 104 may reflect a greater amount of EM radiation than an enhanced bond. In this example, control module 218 may detect formation of an enhanced bond based on a decrease in the amount of EM radiation detected at reflection sensor 224. Therefore, control module 218 may actuate laser 106 to move from a current position when the amount of EM radiation incident on reflection sensor 224 decreases and/or when the amount of EM radiation on sensor 222 increases since either of these scenarios may indicate the formation of an enhanced bond.

FIG. 12 illustrates another example fabrication system 214. Fabrication system 214 is similar to fabrication system 210 of FIG. 10, however, fabrication system 214 includes an inspection camera 226. Inspection camera 226 may acquire images (e.g., in the visual spectrum) of substrates 100, 102 and intermediate layer 104 during the laser bonding process. Inspection camera 226 may include one or more of a variety of imaging technologies, including, but not limited to, charge-coupled-device (CCD) based cameras, or complimentary metal-oxide-semiconductor (CMOS) based cameras.

As described above with respect to FIGS. 3A-3B, prior to directing EM radiation onto intermediate layer 104 to form an enhanced bond, intermediate layer 104 may have a tinted appearance in the visual spectrum. Whereas, after formation of an enhanced bond, the region including the enhanced bond may lack the tinted appearance indicative of intermediate layer 104. Inspection camera 226 may detect the contrast between the tinted appearance indicative of intermediate layer 104 and the absence of the tinted appearance indicative of an enhanced bond. Based on the detection of the absence of the tinted appearance in the visual spectrum, inspection camera 226 may determine when an enhanced bond has been formed. For example, in some cases, based on the contrast that may be present between a tinted appearance of intermediate layer 104 and a clear (i.e., un-tinted) appearance of an enhanced bond, inspection camera 226 may detect the formation of an enhanced bond. Control module 218 may actuate laser 106 to move EM radiation 108 along intermediate layer 104 based on whether the formation of an enhanced bond is detected by inspection camera 226. For example, upon detection of the contrast between intermediate layer 104 and an enhanced bond in the current position of EM radiation, control module 218 may actuate laser 106 to move EM radiation 108 to a new position.

In some examples, the contrast between intermediate layer 104 and an enhanced bond observable in the visible spectrum may be used to inspect substrates 100, 102 to determine whether enhanced bonds have been properly formed during the laser bonding process. For example, after application of EM radiation to intermediate layer 104, if the laser bonding process was successful, the portions of intermediate layer 104 exposed to EM radiation 108 may be transparent. Detection of tinted regions may indicate that enhanced bond formation in those regions was unsuccessful. Detection of unsuccessful enhanced bond formation may allow an operator of fabrication system 214 to further expose the tinted areas to additional EM radiation to form an appropriate enhanced bond. Detection of inappropriately formed bonds, as indicated by tinted regions detected by inspection camera 226, may also allow the operator to discard such potentially defective devices.

Although inspection camera 226 is illustrated as observing the intersection between EM radiation 108 and intermediate layer 104 from an angle, in some examples, inspection camera 226 may be positioned such that inspection camera 226 views the intersection from an angle that is perpendicular to surfaces of first and second substrates 102, 104. For example, a dichroic mirror may be used to reflect an incoming beam in a direction perpendicular to the surface being bonded, and inspection camera 226 may be placed above the dichroic mirror such that inspection camera 226 views the bonding from directly above.

The laser bonding process of the present disclosure may tolerate a wide range of processing parameters. For example, with respect to EM radiation, a wide range of power levels and a wide range of exposure times may be used produce enhanced bonds that perform equally well, e.g., are hermetic and mechanically strong. It has been observed that after formation of an enhanced bond, EM radiation may not be readily absorbed, but instead may be transmitted through the enhanced bond. It follows then that after an enhanced bond is formed, EM radiation may not substantially heat the interface between the two substrates, but instead may be transmitted through the interface. Therefore, in some examples, varying the power level of the EM radiation by a factor of two, four, or even ten times during the laser bonding process may not cause a significant difference in the amount of heat generated when forming the enhanced bond. Such acceptably wide tolerances in the processing parameters of the laser bonding process may result in more positive reproducible results, i.e., higher yields of hermetic, mechanically strong, enhanced bonds.

In some examples, heating of the intermediate layer and the regions of the substrates adjacent to the heated intermediate layer may cause a highly localized viscous flow of the substrates in the region. Such a localized flow may fill local gaps between the substrates and provide a degree of tolerance to substrate surface irregularities. For example, the laser bonding process may provide a gap filling function that produces functional (e.g., hermetic) enhanced bonds, even in circumstances in which gaps of several microns are present between the substrates.

A possible mechanism explaining why the enhanced bonding regions become transparent and gap filling is now described in the case of glass substrates and an amorphous silicon intermediate layer. During the laser bonding process, the intermediate layer between the two glass substrates may be heated due to absorbed EM radiation. Heating in the intermediate layer may in turn locally heat the substrates (e.g., via conduction). Heating in the substrates may cause a localized flow of the substrates and the intermediate layer may begin to dissolve into the localized flow of the substrates. Such localized flow may provide the gap filling property of the laser bonding process. In some examples, the intermediate layer may coalesce into spheroids of significantly reduced area that, due to the reduction in area, absorb less incident EM radiation. This reduction in absorption area may lead to the increased transparency of the enhanced bonding region.

Figure 13:
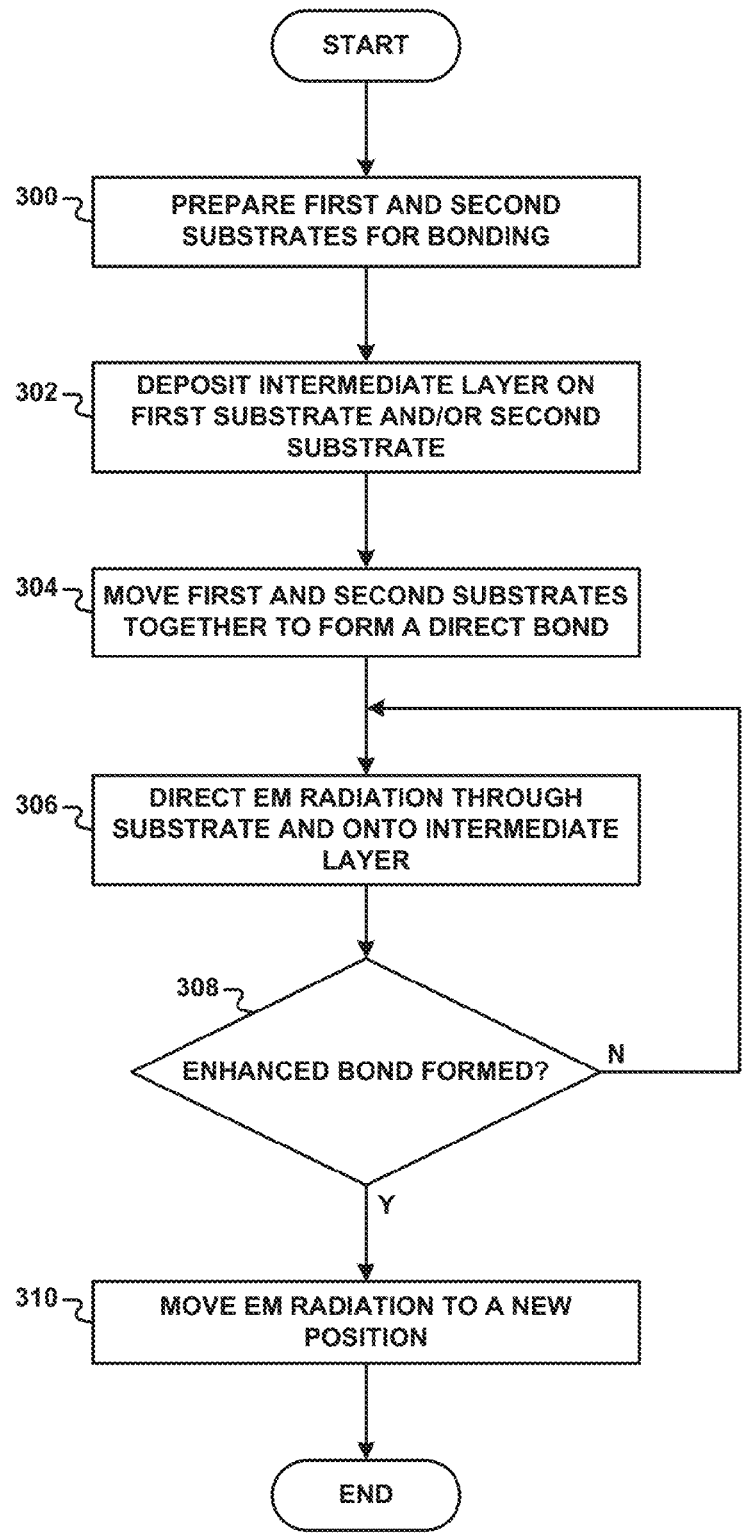
FIG. 13 illustrates an example method of fabricating an enhanced bond according to the present disclosure.

FIG. 13 illustrates an example method of fabricating an enhanced bond according to the present disclosure. First and second substrates 100, 102 are first prepared for deposition of intermediate layer 104 and direct bonding (300), according to the method of FIG. 2, for example. Intermediate layer 104 is then deposited on first substrate 100 and/or second substrates 102 (302). First and second substrates 100, 102 are then moved together such that intermediate layer 104 is sandwiched between first and second substrates 100, 102. A direct bond may be formed after sandwiching intermediate layer 104 between first and second substrates 100, 102 (304). EM radiation 108 may then be directed through one of the first and second substrates 100, 102 and onto intermediate layer 104 (306).

Control module 218, for example, may then determine whether an enhanced bond is formed at the region of intermediate layer 104 receiving EM radiation 108 (308). In some examples, control module 218 may determine that an enhanced bond is formed at the region based on a predetermined amount of time that has passed since directing EM radiation 108 onto intermediate layer 104. For example, control module 218 may actuate laser 106 to move EM radiation 108 at a predetermined rate over intermediate layer 104 such that portions of intermediate layer 104 are subjected to EM radiation 108 for a predetermined amount of time sufficient to form an enhanced bond between first and second substrates 100, 102.

In other examples control module 218 may detect when an enhanced bond is formed based on data received from detection module 220. For example, control module 218 may determine when an enhanced bond is formed based on an amount of EM radiation reflected off of intermediate layer 104 and/or an amount of EM radiation exiting first substrate 100. In still other examples, control module 218 may detect formation of an enhanced bond based on analysis of images (e.g., in the visual spectrum) taken of intermediate layer 104 by inspection camera 226, as described with respect to FIG. 12. In this example, control module 218 may detect formation of an enhanced bond based on a contrast between a tinted intermediate layer 104 and a transparent enhanced bond.

Regardless of the method used to detect formation of an enhanced bond in block (308), if control module 218 determines that an enhanced bond is not formed in block (308), EM radiation 108 is maintained in the same location to further heat intermediate layer 104 in order to form an enhanced bond (306). If control module 218 determines that an enhanced bond is formed in block (308), control module 218 may actuate laser 106 to move EM radiation 108 to a new position (310).

The enhanced bonding regions described in the present disclosure may present enhanced mechanical properties relative to a direct bond. For example, the regions in which enhanced bonds are formed have a greater strength than regions connected with direct bonds. In some examples, the regions including enhanced bonds may have a greater strength than the bulk strength of the substrates themselves.

Figure 14:
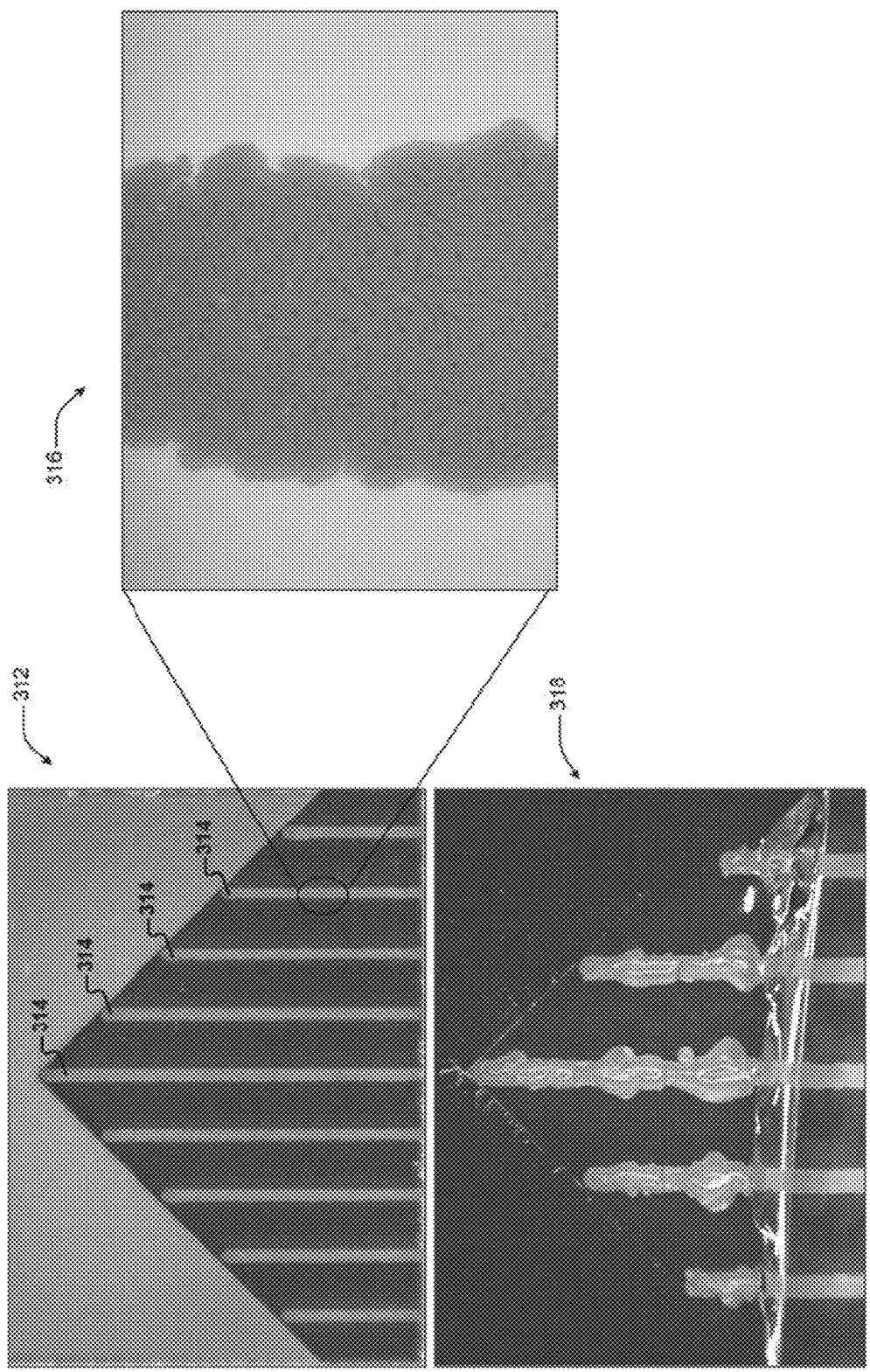
FIG. 14 shows plan views of an example chevron test structure used to determine the bond strength of example enhanced bonds.

FIG. 14 shows plan views of an example chevron test structure used to determine the bond strength of example enhanced bonds. The enhanced bonds illustrated in the images of FIG. 14 were fabricated using borosilicate glass substrates and an amorphous silicon intermediate layer. Image 312 includes lines 314 that indicate enhanced bonding regions between the borosilicate glass substrates. The plan views of FIG. 14 show the chevron test structure as viewed through a microscope from above such that the enhanced bonds are viewed through one of the glass substrates. Image 316 shows a magnified view of one of the enhanced bonds. Image 318 illustrates one of the glass substrates after the enhanced bonds were pulled apart. Breaks between the two glass substrates in the area of the enhanced bonds do not occur cleanly along the region of enhanced bond formation. Instead, the breaks formed in the enhanced bonding regions transition from one substrate to another substrate in a random fashion. This may indicate that the enhanced bond according to the present disclosure may have a relatively greater strength than the bulk of the glass substrates. In summary, the tests illustrated in FIG. 14 show that a failure mode in a glass/amorphous silicon/glass example stack occurs in the bulk of the glass substrates, indicating that the glass substrates may be fused.

In addition to enhanced mechanical strength, the bonds may also present enhanced corrosion resistance. In some examples, the enhanced bonds may generally etch at a slower rate than the bulk of the glass substrates upon exposure to an etchant, e.g., an acidic solution of HF acid for example. In other words, etching may be observed in the bulk of the glass substrates at a higher rate than is observed in the enhanced bonding region.

Figure 15:
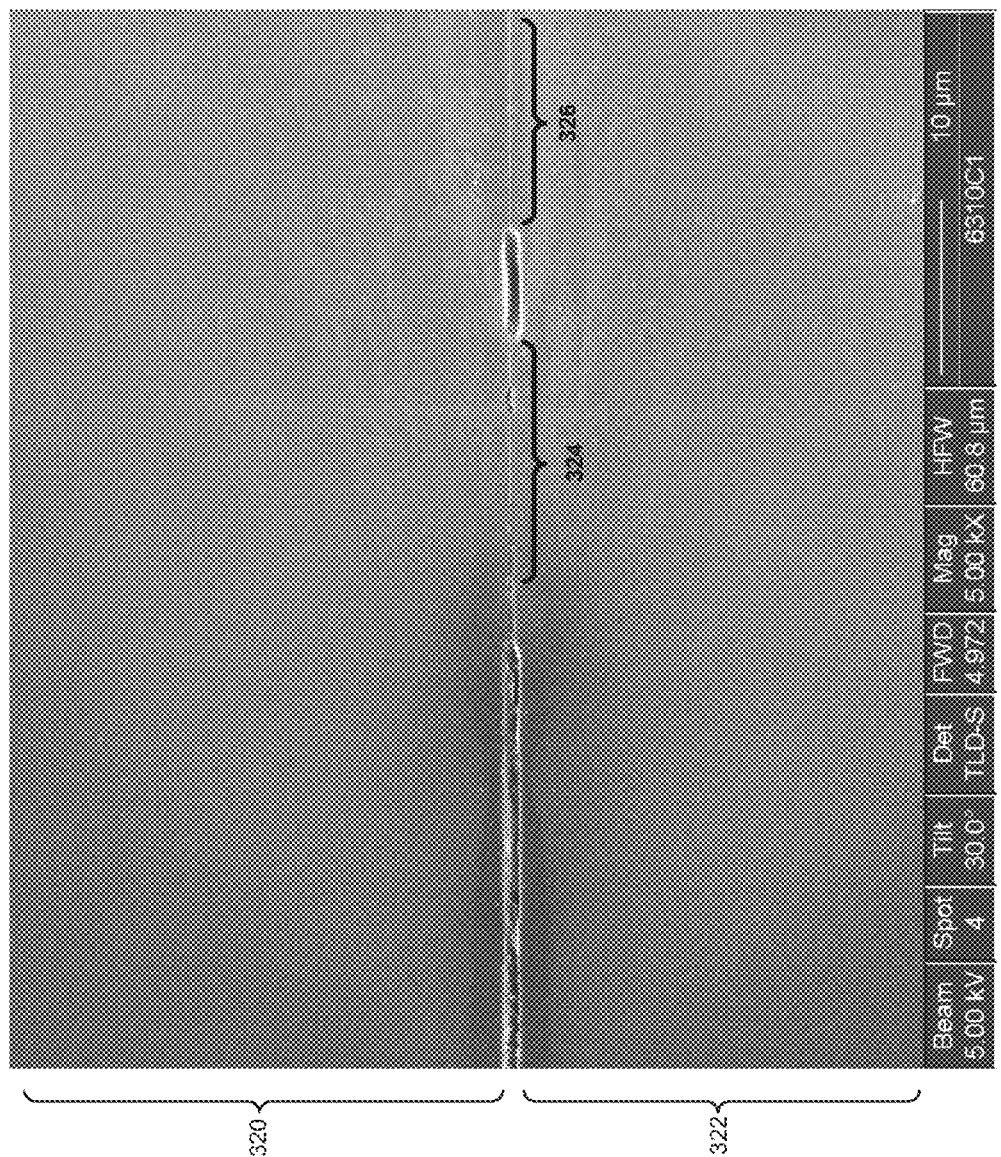
FIG. 15 shows a scanning electron microscope (SEM) image of a cross section of enhanced bonding regions between two borosilicate glass substrates.

Referring now to FIG. 15, a scanning electron microscope (SEM) image of a cross section of enhanced bonding regions between two borosilicate substrates 320, 322 is shown. Substrates 320, 322 are bonded using enhanced bonds 324, 326. Other regions between substrates 320, 322 may not include enhanced bonds, but instead may include other material. The regions between substrates 320, 322 which do not include enhanced bonds 324, 326 in FIG. 15 were regions that were not treated by a laser, and which were partially etched out after formation of enhanced bonds 324, 326. In regions 324, 326, where enhanced bonding was performed, borosilicate substrates 320, 322 are visibly flush with one another, which may be indicative of fusing between substrates 320, 322 in the regions 324, 326. Furthermore, based on the SEM image of FIG. 15, three distinct layers (e.g., glass/silicon/glass) are not readily visible in regions 324, 326, which may indicate that the amorphous silicon intermediate layer may have partially or completely mixed with the glass substrates during bonding. In regions where an enhanced bond is not formed, the interface between substrates 320, 322 is visibly rougher and substrates 320, 322 are not flush with one another.

Various examples have been described. These and other examples are within the scope of the following claims.

The invention claimed is:

1. A device comprising:
 a first substrate that is transparent to a wavelength of a first EM radiation;
 a second substrate; and
 an intermediate layer disposed between the first and second substrates, wherein the first and second substrates are fused together through the intermediate layer, and wherein a bonding region of the intermediate layer that is adjacent the first and second substrates is configured to receive the first electromagnetic (EM) radiation that is transmitted through the first substrate to fuse the first and second substrates without causing the first and second substrates to melt or flow.

2. The device of claim 1, wherein the bonding region of the intermediate layer is configured to absorb the EM radiation and melt to result in the fusion of the first and second substrates.

3. The device of claim 1, wherein the bonding region of the intermediate layer and the adjacent first and second substrates have a greater strength relative to the bulk strength of the first and second substrates.

4. The device of claim 1, wherein the intermediate layer is configured having a thickness of greater than 60 nanometers.

5. The device of claim 1, wherein a surface of at least one of the first and second substrates that is adjacent to the intermediate layer is devoid of surface deformities.

6. The device of claim 1, wherein the bonding region, as viewed through the first substrate, is transparent to wavelengths of the first EM radiation in the visible spectrum.

7. The device of claim 1, wherein:
 the first substrate comprises at least one of glass, quartz, silica, sapphire, silicon carbide, diamond, and gallium nitride, and
  the second substrate comprises at least one of glass, quartz, silica, sapphire, silicon carbide, diamond, and gallium nitride.

8. The device of claim 1, wherein the intermediate layer comprises an amorphous silicon thin film.

9. The device of claim 1, wherein the intermediate layer comprises at least one of a metal thin film, a metal alloy, and a multilayer structure.

10. The device of claim 1, wherein the first and second substrates at least partially define an enclosed cavity, and wherein the bonding region circumscribes the enclosed cavity.

11. The device of claim 10, wherein the bonding region hermetically seals the enclosed cavity from an environment external to the enclosed cavity.

12. The device of claim 10, further comprising an electronic component housed within the enclosed cavity.

13. The device of claim 10, wherein the electronic component includes at least one of an integrated circuit, a sensor, an energy storage device, and an antenna.

14. The device of claim 10, wherein at least one of the first and second substrates includes a via that extends from the enclosed cavity to an environment external to the enclosed cavity, and wherein the electronic component is electrically coupled to the via.

15. The device of claim 1, wherein one of the first and second substrates includes at least one or more cavities.

16. The device of claim 15, further comprising disposing electronic components within the at least one cavity.

17. The device of claim 15, wherein the bonding region hermetically seals the enclosed cavity from an environment external to the enclosed cavity.

18. The device of claim 15, wherein the intermediate layer is deposited to circumscribe the at least one cavity, and the first and second substrates are arranged to be fused in the regions circumscribing the at least one cavity.

19. The device of claim 1, wherein the bonding region of the intermediate layer is tinted in the visible spectrum prior to directing EM radiation onto the region, and wherein the region is transparent and colorless in the visible spectrum after the first and second substrates are fused in the region.

20. The device of claim 1, wherein the second substrate is configured to be transparent to the wavelength of the first EM radiation.

21. The device of claim 1, wherein the first EM radiation is selected having a wavelength that is absorbable by the intermediate layer to cause melting of the intermediate layer.

* * * * *